United States Patent
Tanaka et al.

(10) Patent No.: US 9,143,113 B2
(45) Date of Patent: Sep. 22, 2015

(54) RESONATOR ELEMENT, RESONATOR, OSCILLATOR, ELECTRONIC APPARATUS, AND MOVING OBJECT

(71) Applicant: Seiko Epson Corporation, Tokyo (JP)

(72) Inventors: Masako Tanaka, Okaya (JP); Naohisa Obata, Minowa (JP); Masayuki Kikushima, Ina (JP)

(73) Assignee: Seiko Epson Corporation (JP)

( * ) Notice: Subject to any disclaimer, the term of this patent is extended or adjusted under 35 U.S.C. 154(b) by 0 days.

(21) Appl. No.: 14/228,430

(22) Filed: Mar. 28, 2014

(65) Prior Publication Data

US 2014/0292437 A1     Oct. 2, 2014

(30) Foreign Application Priority Data

Mar. 29, 2013  (JP) ................. 2013-075015
Jan. 30, 2014  (JP) ................. 2014-016245

(51) Int. Cl.
| | |
|---|---|
| *H01L 41/09* | (2006.01) |
| *H03B 5/32* | (2006.01) |
| *H03H 9/17* | (2006.01) |
| *H03H 9/02* | (2006.01) |
| *H03H 9/19* | (2006.01) |

(52) U.S. Cl.
CPC ....... *H03H 9/02023* (2013.01); *H01L 41/0913* (2013.01); *H03H 9/02062* (2013.01); *H03H 9/172* (2013.01); *H03H 9/19* (2013.01); *H03B 5/32* (2013.01)

(58) Field of Classification Search
CPC . H01L 41/053; H01L 41/083; H01L 41/0906; H01L 41/0913; H01L 41/0993; H03B 5/30; H03B 5/32; H03H 9/0538; H03H 9/17; H03H 9/172; H03H 9/21; H03H 9/2468
USPC .......... 310/311, 348, 368, 370; 331/154, 156, 331/158
See application file for complete search history.

(56) References Cited

U.S. PATENT DOCUMENTS

| | | | |
|---|---|---|---|
| 5,307,034 A * | 4/1994 | Morita et al. ................. | 333/187 |
| 7,098,574 B2 | 8/2006 | Iwata | |
| 7,861,389 B2 * | 1/2011 | Naito et al. ................. | 29/25.35 |
| 8,026,652 B2 | 9/2011 | Yasuike | |
| 2012/0133248 A1 * | 5/2012 | Kusano ........................ | 310/348 |
| 2012/0306321 A1 | 12/2012 | Ishii | |
| 2013/0043959 A1 | 2/2013 | Ishii | |

(Continued)

FOREIGN PATENT DOCUMENTS

| | | | |
|---|---|---|---|
| JP | 2001-144578 A | 5/2001 | |
| JP | 2002-033640 A | 1/2002 | |

(Continued)

*Primary Examiner* — Levi Gannon
(74) *Attorney, Agent, or Firm* — Harness, Dickey & Pierce, P.L.C.

(57) ABSTRACT

A resonator element includes a piezoelectric substrate including a vibrating section and a thick section having a thickness larger than that of the vibrating section. The thick section includes a first thick section provided along a first outer edge of the vibrating section, a second thick section provided along a second outer edge, and a third thick section provided along a third outer edge. A first inclined outer edge section that is inclined with respect to both of an X axis direction and a Z' axis direction is provided in a corner section of the piezoelectric substrate where the second thick section and the third thick section are connected to each other.

16 Claims, 21 Drawing Sheets

(56) References Cited

U.S. PATENT DOCUMENTS

| | | |
|---|---|---|
| 2013/0043960 A1 | 2/2013 | Ishii et al. |
| 2014/0203689 A1 | 7/2014 | Obata |
| 2014/0253253 A1 | 9/2014 | Kikushima et al. |

FOREIGN PATENT DOCUMENTS

| | | |
|---|---|---|
| JP | 2002-198772 A | 7/2002 |
| JP | 2003-264446 A | 9/2003 |
| JP | 2004-165743 A | 6/2004 |
| JP | 2006-203700 A | 8/2006 |
| JP | 2009-164824 A | 7/2009 |
| JP | 2012-253630 A | 12/2012 |
| JP | 2013-042410 A | 2/2013 |
| JP | 2013-042440 A | 2/2013 |
| JP | 2013-046189 A | 3/2013 |
| JP | 2014-138413 A | 7/2014 |

\* cited by examiner

RESONATOR ELEMENT, RESONATOR, OSCILLATOR, ELECTRONIC APPARATUS, AND MOVING OBJECT

BACKGROUND

1. Technical Field

The present invention relates to a resonator element, a resonator, an oscillator, an electronic apparatus and a moving object.

2. Related Art

An AT-cut quartz crystal resonator element exhibits a thickness shear vibration in a vibration mode of main vibration for excitation. Since the AT-cut quartz crystal resonator element is suitable for miniaturization and increase in frequency and provides a cubic curve having an excellent frequency-temperature characteristic, the AT-cut quartz crystal resonator element is used in various apparatuses such as a piezoelectric oscillator and an electronic apparatus.

JP-A-2002-198772 discloses an AT-cut quartz crystal resonator element having an inverted mesa structure that includes a thin vibrating section and a thick section provided around the entire periphery of the vibrating section. The AT-cut quartz crystal resonator element is fixed to a package through an adhesive agent in one end portion of the thick section. In a state where the AT-cut quartz crystal resonator element is cantilevered, if an acceleration in a thickness direction is applied to the AT-cut quartz crystal resonator element, a tip section (the vibrating section) is deformed, which causes a problem in that a vibration characteristic (frequency characteristic) is not stable. In particular, in the AT-cut quartz crystal resonator element disclosed in JP-A-2002-198772, since the thick section is formed over the entire periphery of the vibrating section and the weight of the tip section is heavy, the influence on the acceleration is large, and accordingly, the amount of frequency deviation is also increased. Here, in order to reduce the deformation of the tip section (vibrating section), a method of increasing the thickness of the thick section to enhance the rigidity may be considered. However, if the thickness of the thick section increases, the accuracy of formation of the vibrating section in wet etching is decreased, which causes a problem in that a vibration characteristic of an obtained resonator element does not reach a predetermined characteristic.

SUMMARY

An advantage of some aspects of the invention is to provide a resonator element, a resonator, an oscillator, an electronic apparatus and a moving object capable of reducing change in a vibration characteristic due to an external force such as an acceleration (vibration) while suppressing an increase in size (increase in thickness) to achieve a stable vibration characteristic.

The invention can be implemented as the following application examples.

Application Example 1

This application example is directed to a resonator element including: a substrate that includes a first region having a vibration region that vibrates with a thickness shear vibration, and a second region that is integrated with the first region and has a thickness larger than that of the first region; and excitation electrodes that are respectively provided on a first main surface and a second main surface that are front and rear surfaces of the vibration region, in which the first region includes first and second outer edges that are provided to be spaced apart from each other in a vibration direction of the thickness shear vibration and intersect with the vibration direction and third and fourth outer edges that are provided to be spaced apart from each other in a direction that is orthogonal to the vibration direction, in which the second region includes a first thick section that is provided along the first outer edge and is provided with a fixing section to be fixed to a target, a second thick section that is provided along the second outer edge and a third thick section that is provided along the third outer edge and is connected to the first thick section and the second thick section, and in which a first outer edge section that intersects with the vibration direction and the direction that is orthogonal to the vibration direction is provided in a connecting section where the second thick section and the third thick section of the substrate are connected, in a plan view.

With this configuration, it is possible to obtain a resonator element in which the mass on the tip side (opposite to the fixing section) is reduced, change in a vibration characteristic due to an external force such as acceleration (vibration) is suppressed and a stable vibration characteristic is achieved. Further, it is possible to reduce the thickness of the thick section, and to suppress an increase in the size of the resonator element.

Application Example 2

In the resonator element according to this application example, it is preferable that the first outer edge section be a first inclined outer edge section that is inclined with respect to the vibration direction and the direction that is orthogonal to the vibration direction, in the plan view, and that an inclination angle of the first inclined outer edge section with respect to the vibration direction be 30° or greater and 60° or less.

With this configuration, it is possible to effectively achieve the mass reduction effect of the first inclined outer edge section.

Application Example 3

In the resonator element according to this application example, it is preferable that the length of the second thick section in the vibration direction be 40 μm or greater and 100 μm or less.

With this configuration, it is possible to further reduce the mass of the tip side.

Application Example 4

In the resonator element according to this application example, it is preferable that the thickness of the second region be 50 μm or greater and 70 μm or less.

With this configuration, it is possible to form the first region with high accuracy while enhancing the rigidity of the resonator element.

Application Example 5

In the resonator element according to this application example, it is preferable that the length of the third thick section in the direction that is orthogonal to the vibration direction be 200 μm or greater.

With this configuration, it is possible to sufficiently enhance the rigidity of the resonator element.

Application Example 6

In the resonator element according to this application example, it is preferable that a second outer edge section that intersects with the vibration direction and the direction that is orthogonal to the vibration direction be provided in an end section of the second thick section on a side opposite to the third thick section, in the plan view.

With this configuration, it is possible to further reduce the mass of the tip side.

Application Example 7

In the resonator element according to this application example, it is preferable that the second outer edge section be a second inclined outer edge section that is inclined with respect to the vibration direction and the direction that is orthogonal to the vibration direction, in the plan view, and that an inclination angle of the second inclined outer edge section with respect to the vibration direction be 30° or greater and 60° or less.

With this configuration, it is possible to effectively achieve the mass reduction effect of the second inclined outer edge section.

Application Example 8

In the resonator element according to this application example, it is preferable that the second inclined outer edge section be provided over the first region.

With this configuration, it is possible to more effectively achieve the mass reduction effect of the second inclined outer edge section.

Application Example 9

In the resonator element according to this application example, it is preferable that when an electrical axis, a mechanical axis and an optical axis that are crystal axes of a quartz crystal are respectively represented as an X axis, a Y axis and a Z axis, and when an axis obtained by inclining the Z axis so that a +Z side is rotated in a −Y direction of the Y axis is represented as a Z' axis and an axis obtained by inclining the Y axis so that a +Y side is rotated in a +Z direction of the Z axis is represented as a Y' axis, using the X axis as a rotation axis, the substrate be a quartz crystal plate in which a surface including the X axis and the Z' axis corresponds to a main surface and a direction of the Y' axis corresponds to a thickness.

With this configuration, it is possible to obtain a resonator element having an excellent temperature characteristic.

Application Example 10

This application example is directed to a resonator including the resonator element according to the application example described above and a package in which the resonator element is accommodated.

With this configuration, it is possible to obtain a resonator with high reliability.

Application Example 11

This application example is directed to an oscillator including the resonator element according to the application example described above and an oscillation circuit that drives the resonator element.

With this configuration, it is possible to obtain an oscillator with high reliability.

Application Example 12

This application example is directed to an electronic apparatus including the resonator element according to the application example described above.

With this configuration, it is possible to obtain an electronic apparatus with high reliability.

Application Example 13

This application example is directed to a moving object including the resonator element according to the application example described above.

With this configuration, it is possible to obtain a moving object with high reliability.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, a resonator element, a resonator, an oscillator, an electronic apparatus and a moving object according to the invention will be described in detail with reference to preferable embodiments shown in the accompanying drawings.

1. Resonator Element

First, the resonator element according to the invention will be described.

First Embodiment

Figure 1:
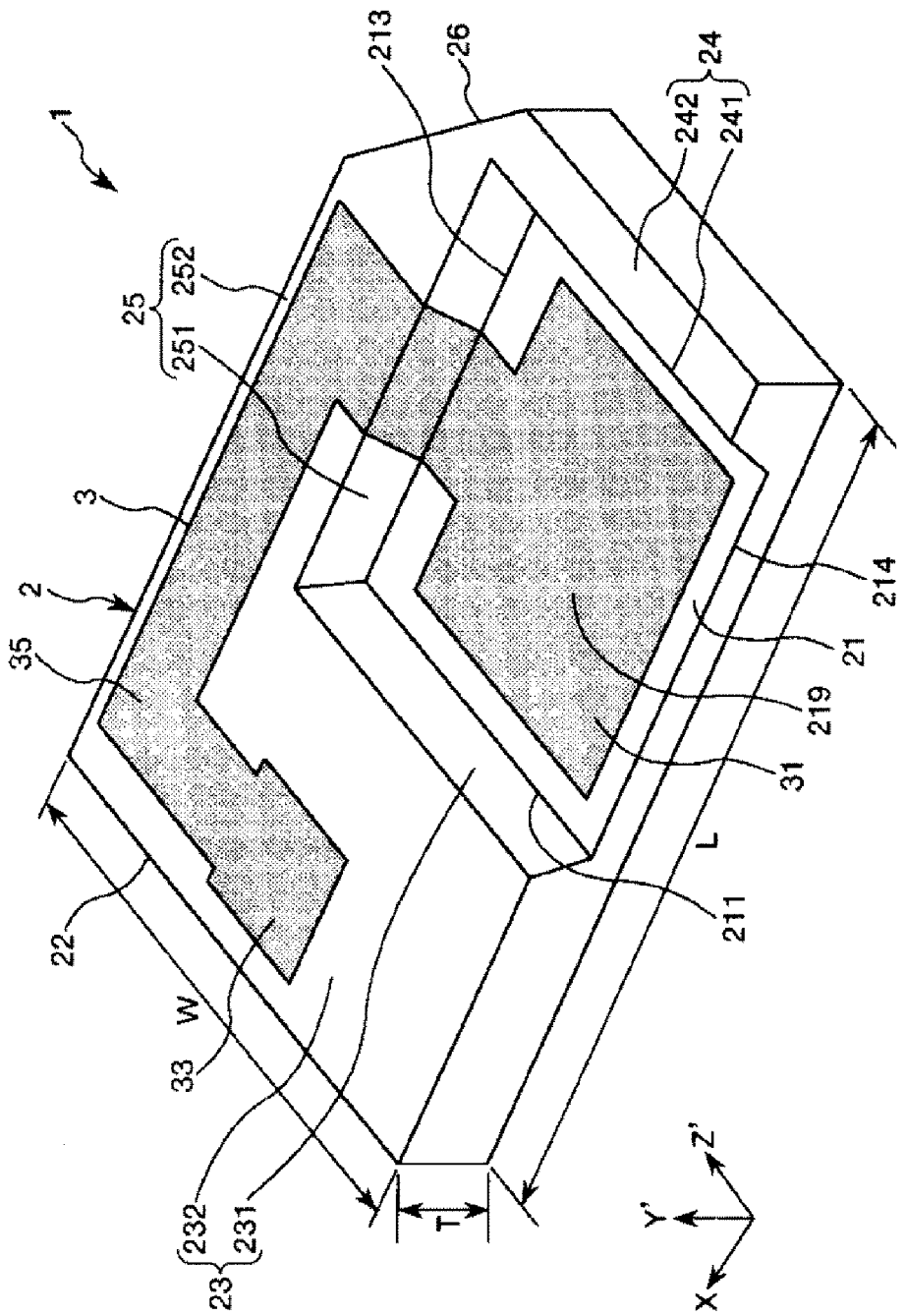
FIG. 1 is a perspective view illustrating a resonator element according to a first embodiment of the invention.
Figure 2:
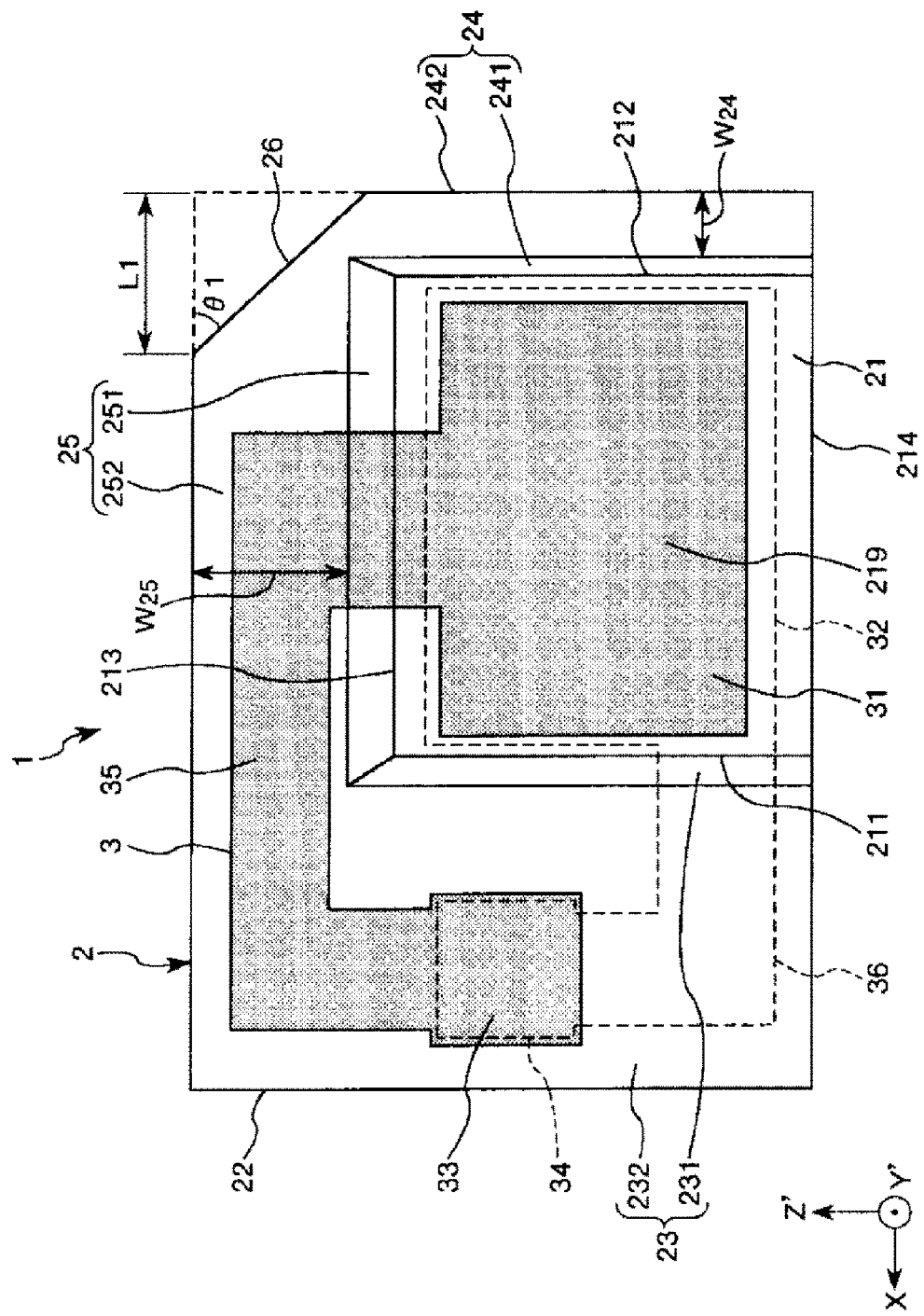
FIG. 2 is a plan view illustrating the resonator element shown in FIG. 1.
Figure 3:
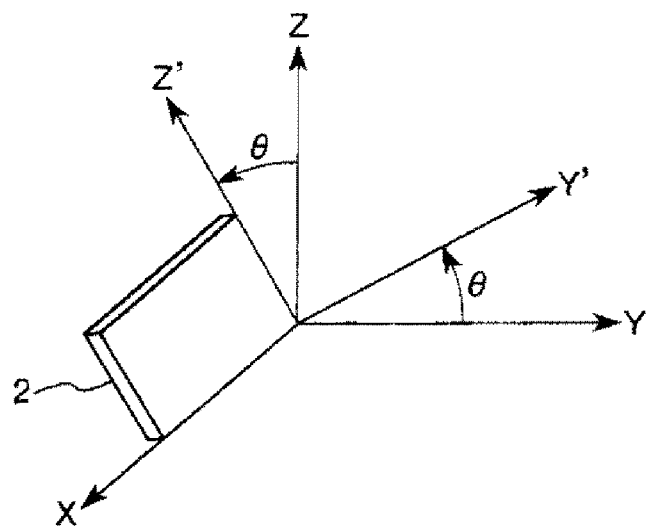
FIG. 3 is a diagram illustrating the relationship between an AT-cut quartz crystal substrate and a crystal axis of a quartz crystal.
Figure 4:
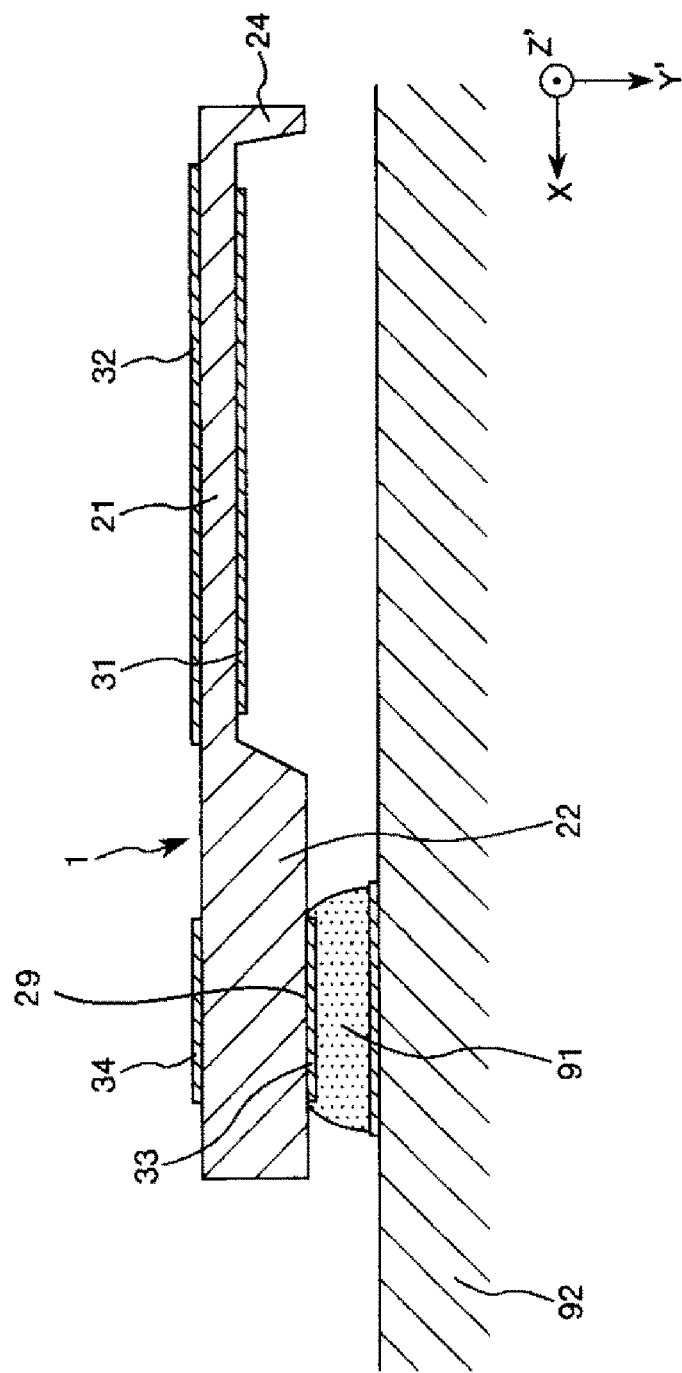
FIG. 4 is a side view illustrating a state where the resonator element shown in FIG. 1 is fixed to a target.
Figure 5:
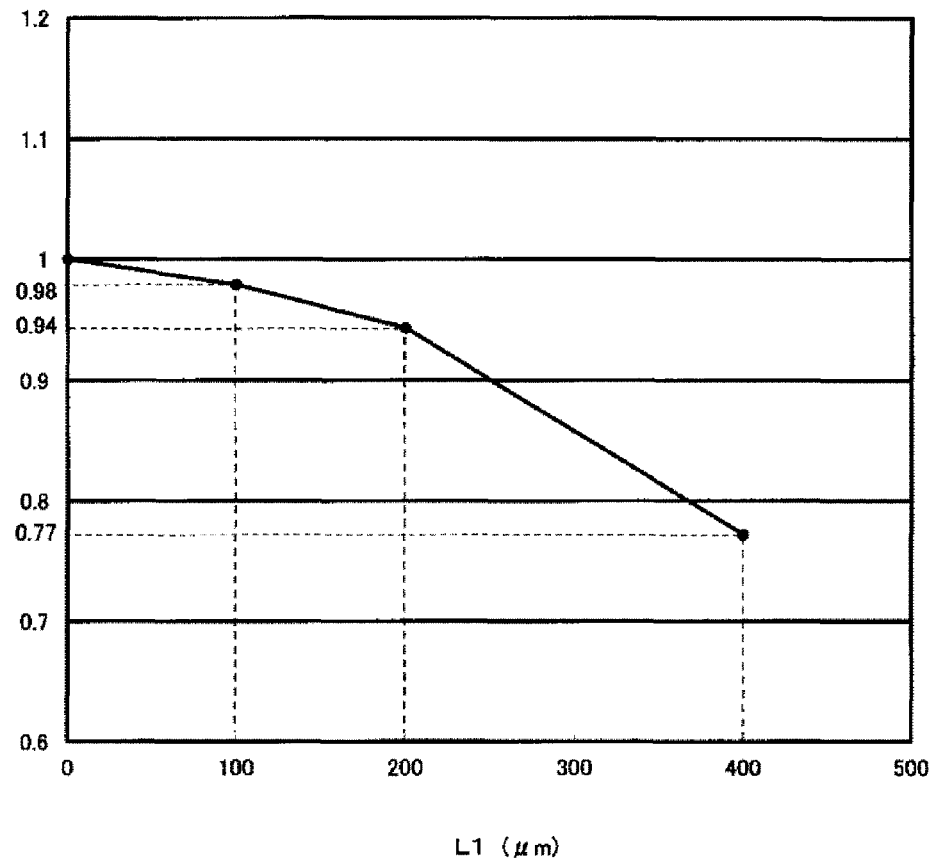
FIG. 5 is a graph illustrating the relationship between the size of a first inclined outer edge section and G sensitivity.
Figure 6:
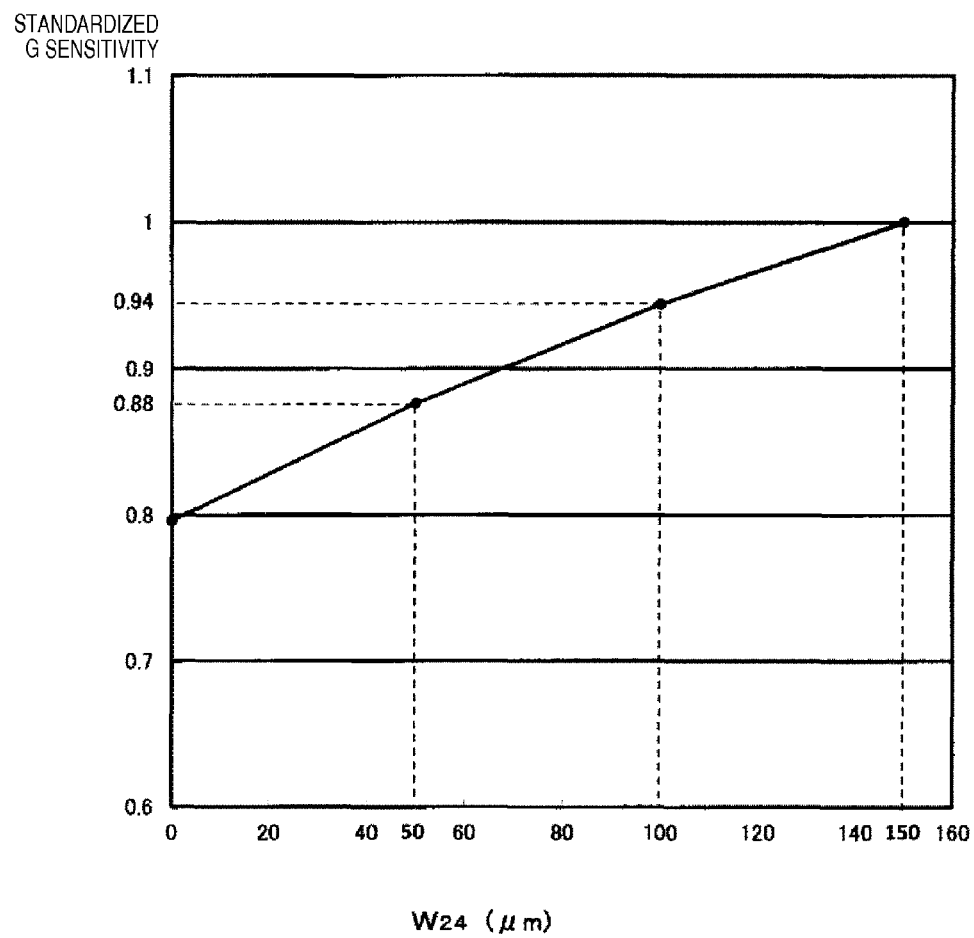
FIG. 6 is graph illustrating the relationship between the width of a second thick section and G sensitivity.
Figure 7:
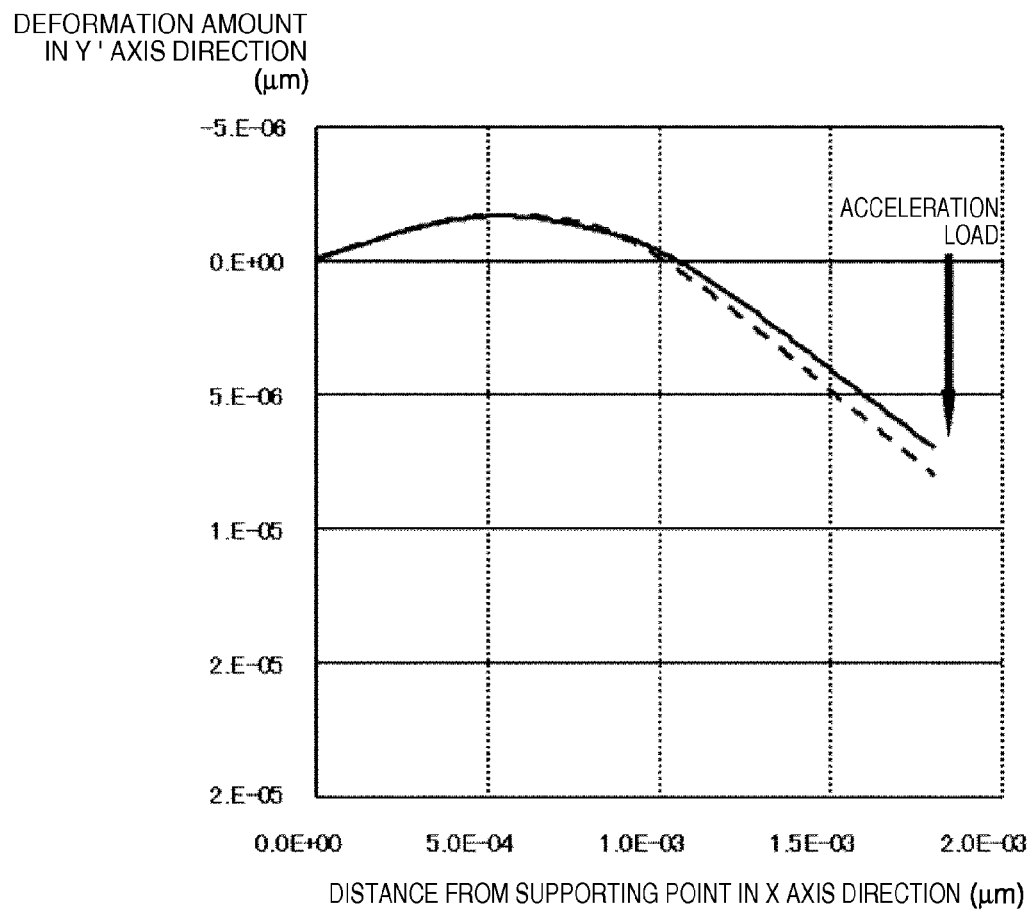
FIG. 7 is a graph illustrating the relationship between the width of the second thick section and the amount of deformation.
Figure 8:
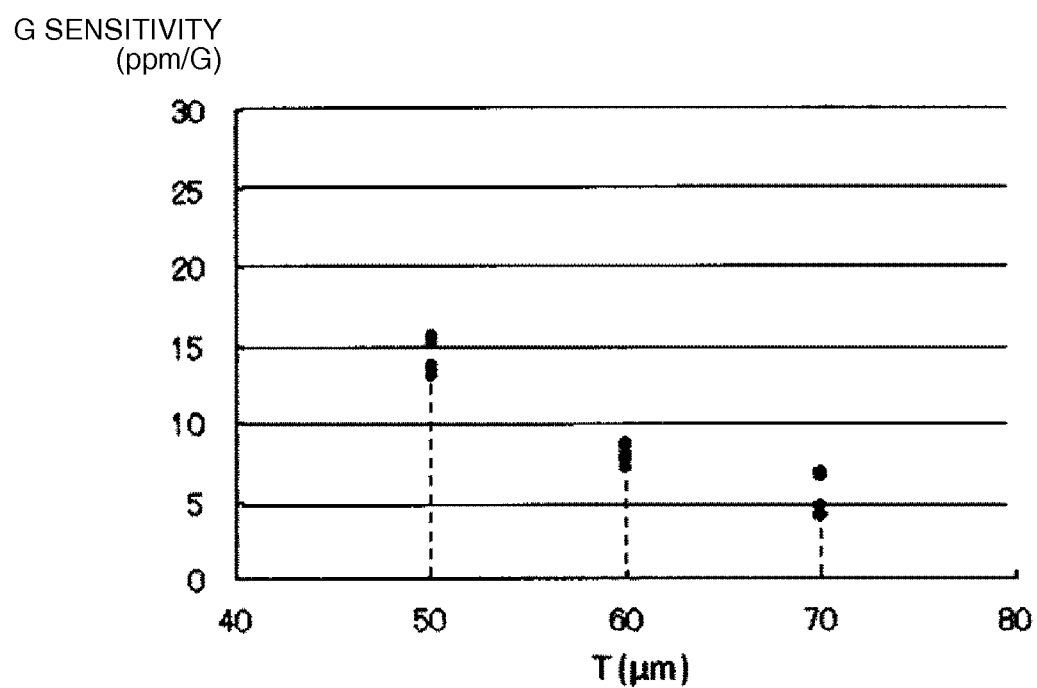
FIG. 8 is a graph illustrating the relationship between the thickness of a thick section and G sensitivity.
Figure 9:
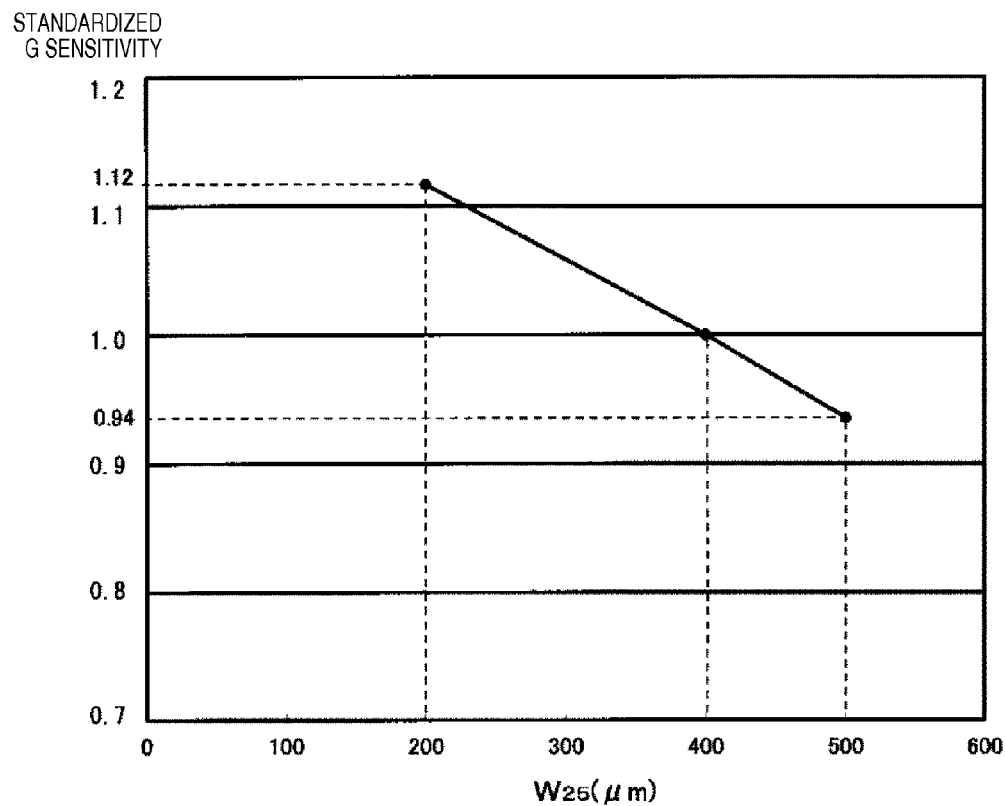
FIG. 9 is a graph illustrating the relationship between the width of a third thick section and G sensitivity.
Figure 10A:
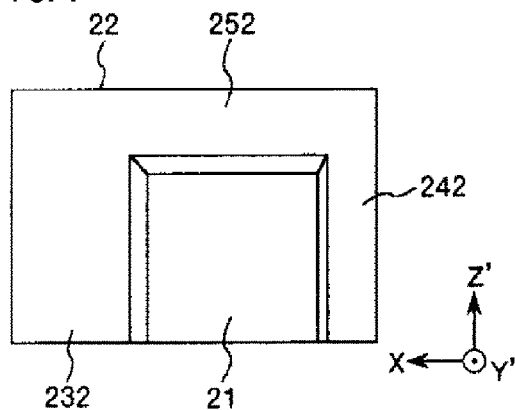
FIGS. 10A to 10E are diagrams illustrating patterns for reducing the mass of a tip section of the resonator element.
Figure 11:
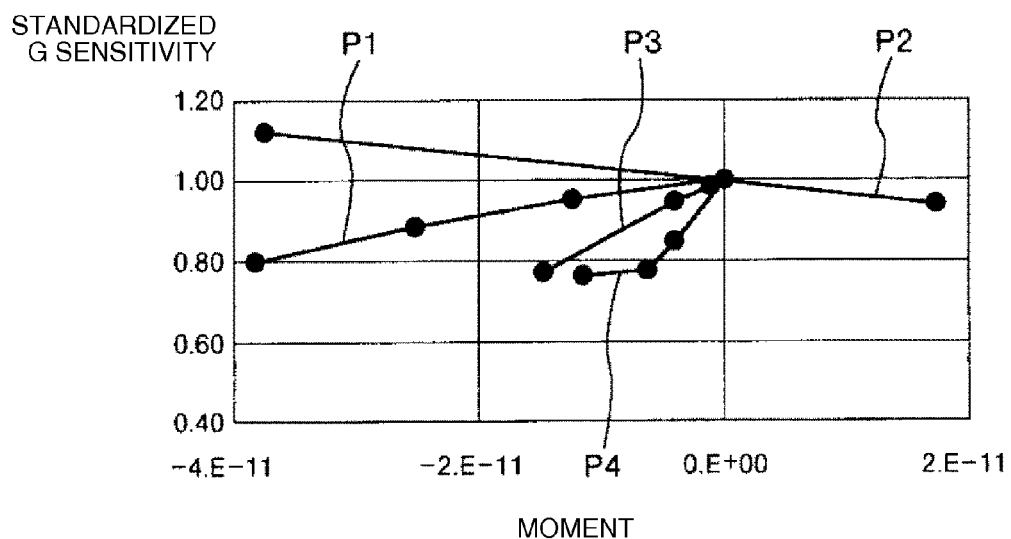
FIG. 11 is a graph illustrating the relationship between the moment of a removed section of each pattern shown in FIGS. 10A to 10E and G sensitivity.
Figure 12:
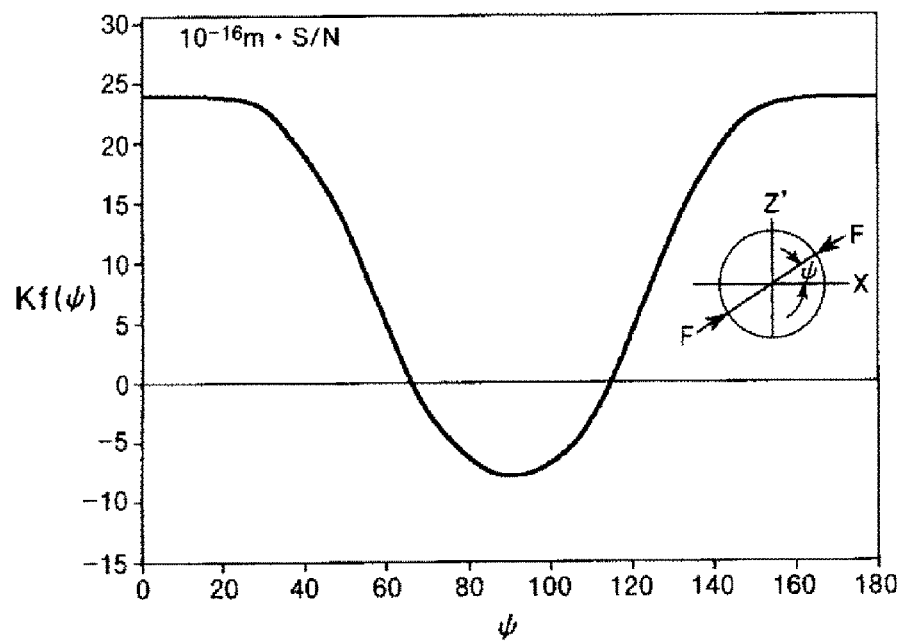
FIG. 12 is a graph illustrating the relationship between a crystal axis of a quartz crystal and stress sensitivity.

FIG. 1 is a perspective view illustrating a resonator element according to a first embodiment of the invention. FIG. 2 is a plan view illustrating the resonator element shown in FIG. 1. FIG. 3 is a diagram illustrating the relationship between an AT-cut quartz crystal substrate and a crystal axis of a quartz crystal. FIG. 4 is a side view illustrating a state where the resonator element shown in FIG. 1 is fixed to a target. FIG. 5 is a graph illustrating the relationship between the size of a first inclined outer edge section and G sensitivity. FIG. 6 is graph illustrating the relationship between the width of a second thick section and G sensitivity. FIG. 7 is a graph illustrating the relationship between the width of the second thick section and the amount of deformation. FIG. 8 is a graph illustrating the relationship between the thickness of a thick section and G sensitivity. FIG. 9 is a graph illustrating the relationship between the width of a third thick section and G sensitivity. FIGS. 10A to 10E are diagrams illustrating patterns for reducing the mass of a tip section of the resonator element. FIG. 11 is a graph illustrating the relationship between the moment of a removed section of each pattern shown in FIGS. 10A to 10E and G sensitivity. FIG. 12 is a graph illustrating the relationship between a crystal axis of a quartz crystal and stress sensitivity. Hereinafter, for ease of description, a right side in FIG. 2 is referred to as a tip, and a left side therein is referred to as a base end.

As shown in FIGS. 1 and 2, a resonator element 1 includes a piezoelectric substrate (substrate) 2, and an electrode 3 formed on the piezoelectric substrate 2.

Piezoelectric Substrate

The piezoelectric substrate 2 is a plate-like quartz crystal substrate. Here, a quartz crystal that is a material of the piezoelectric substrate 2 belongs to a trigonal system, and has crystal axes X, Y and Z that are orthogonal to each other, as shown in FIG. 3. The X axis, Y axis and Z axis are referred to as an electrical axis, a mechanical axis, and an optical axis, respectively. The piezoelectric substrate 2 of the present embodiment is a "rotated Y-cut quartz crystal substrate" cut along a plane obtained by rotating an XZ plane around the X axis by a predetermined angle θ, in which a substrate cut along a plane obtained by a rotation of θ=35° 15', for example, is referred to as an "AT-cut quartz crystal substrate". By using such a quartz crystal substrate, the resonator element 1 having an excellent temperature characteristic is achieved. Here, as the piezoelectric substrate 2, instead of the AT-cut piezoelectric substrate, any substrate that can excite a thickness shear vibration, for example, a BT-cut piezoelectric substrate may be used.

Hereinafter, the Y axis and the Z axis rotated around the X axis corresponding to the angle θ are set as a Y' axis and a Z' axis. That is, the piezoelectric substrate 2 has a thickness in the Y' axis direction, and has an area in an XZ' plane direction.

The piezoelectric substrate 2 forms an approximately rectangular shape in which a direction along the X axis corresponds to long sides and a direction along the Z' axis corresponds to short sides in a plan view. Further, in the piezoelectric substrate 2, the –X axis direction corresponds to the tip side, and the +X axis direction corresponds to the base end side.

As shown in FIGS. 1 and 2, the piezoelectric substrate 2 includes a vibrating section (a first region) 21 having a thin vibration region (a region where vibration energy is confined) 219, and a thick section (a second region) 22 that is integrated with the vibrating section 21 and has a thickness larger than that of the vibration region 219. The vibrating section 21 may be formed by forming a recessed section by wet etching on a main surface of the quartz crystal substrate on a +Y axis side, for example.

The vibrating section 21 is shifted in the –X axis direction and the –Z' axis direction with reference to the center of the piezoelectric substrate 2, of which a part of an outer edge is exposed from the thick section 22. Specifically, the vibrating section 21 includes a first outer edge 211 and a second outer edge 212 that are separated in the X axis direction (a vibration direction of the thickness shear vibration) and extend in the Z' axis direction (a direction intersecting with the X axis direction) in the plan view of the resonator element 1; and a third outer edge 213 and a fourth outer edge 214 that are separated in the Z' axis direction and extend in the X axis direction. Among the first and second outer edges 211 and 212, the first outer edge 211 is positioned on the +X axis side, and the second outer edge 212 is positioned on the –X axis side. Further, among the third and fourth outer edges 213 and 214, the third outer edge 213 is positioned on the +Z' axis side, and the fourth outer edge 214 is positioned on the –Z' axis side.

The thick section 22 is provided to surround three sides of the vibrating section 21. As shown in FIG. 1, a front surface (main surface on the +Y' axis direction side) of the thick section 22 is provided to protrude toward the +Y' axis direction side from a front surface (main surface on the +Y' axis direction side) of the vibrating section 21. On the other hand, a rear surface (main surface on the –Y' axis direction side) of the thick section 22 is provided on the same plane as a rear surface (main surface on the –Y' axis direction side) of the vibrating section 21.

As shown in FIGS. 1 and 2, the thick section 22 includes a first thick section 23 disposed along the first outer edge 211, a second thick section 24 disposed along the second outer edge 212, and a third thick section 25 that is disposed along the third outer edge 213 and is connected to the first and second thick sections 23 and 24. Accordingly, the thick section 22 forms a structure curved along the vibrating section 21 in the plan view, which has an approximately "U" shape. On the other hand, the thick section 22 is not formed at the fourth outer edge 214 of the vibrating section 21, and the fourth outer edge 214 is exposed from the thick section 22. In this way, by partially providing the thick section 22 along the outer edge of the vibrating section 21 in the approximately "U" shape except for the fourth outer edge 214, it is possible to reduce the mass of the resonator element 1 on the tip side while securing rigidity of the resonator element 1 (vibrating section 21). Further, it is possible to achieve reduction in the size of the resonator element 1.

Here, by providing the third thick section 25 on the +Z' axis side with respect to the vibrating section 21, it is possible to shorten the width (length in the Z' axis direction) of an inclined section 251 (to be described later), compared with a case where the third thick section 25 is provided on the −Z' axis side. Thus, according to the thick section 22 having such a configuration, it is possible to achieve reduction in the size of the resonator element 1.

The first thick section 23 includes an inclined section (residual section) 231 that is connected to the first outer edge 211 and has a thickness gradually increasing in the +X axis direction, and a thick section main body 232 that is connected to an end of the edge of the inclined section 231 on the +X axis direction side and has an approximately uniform thickness. Similarly, the second thick section 24 includes an inclined section (residual section) 241 that is connected to the second outer edge 212 and has a thickness gradually increasing in the −X axis direction, and a thick section main body 242 that is connected to an end of the edge of the inclined section 241 on the −X axis direction side and has an approximately uniform thickness. Similarly, the third thick section 25 includes the inclined section (residual section) 251 that is connected to the third outer edge 213 and has a thickness gradually increasing in the +Z' axis direction, and a thick section main body 252 that is connected to an end of the edge of the inclined section 251 on the +Z' axis direction side and has an approximately uniform thickness.

On the front surface of the thick section main body 232 of the first thick section 23, that is, on the base end side of the resonator element 1, a mounting section (fixing section) 29 is provided. As shown in FIG. 4, the resonator element 1 is fixed to a target 92 using an adhesive material 91 through the mounting section 29. The position of the mounting section 29 is not particularly limited, and for example, the mounting section 29 may be provided on the rear surface of the thick section main body 232.

Electrode

The electrode 3 includes a pair of excitation electrodes 31 and 32, a pair of pad electrodes 33 and 34, and a pair of extraction electrodes 35 and 36. The excitation electrodes 31 and 32 are formed on the front surface (first main surface) and the rear surface (second main surface) that are opposite surfaces of the vibration region 219. Specifically, the excitation electrode 31 is formed on the front surface of the vibration region 219, and the excitation electrode 32 is formed on the rear surface of the vibration region 219. Further, the excitation electrode 32 is disposed to overlap the excitation electrode 31 in the plan view. The excitation electrodes 31 and 32 form an approximately rectangular shape in which the X axis direction corresponds to long sides and the Z' axis direction corresponds to short sides, respectively. Further, the area of the excitation electrode 32 on the rear side is larger than that of the excitation electrode 31 on the front surface side, and the entire region of the excitation electrode 31 is positioned within the excitation electrode 32 in the plan view of the resonator element 1.

The pad electrode 33 is formed in the mounting section 29 of the front surface of the thick section main body 232. On the other hand, the pad electrode 34 is formed to be opposite to the pad electrode 33 on the rear surface of the thick section main body 232.

The extraction electrode 35 extends from the excitation electrode 31, and the excitation electrode 31 and the pad electrode 33 are electrically connected to each other through the extraction electrode 35. Further, the extraction electrode 36 extends from the excitation electrode 32, and the excitation electrode 32 and the pad electrode 34 are electrically connected to each other through the extraction electrode 36. The extraction electrode 36 is provided to not overlap the extraction electrode 35 through the piezoelectric substrate 2 in the plan view. Thus, it is possible to suppress an electrostatic capacitance between the extraction electrodes 35 and 36.

A configuration of the electrode 3 is not particularly limited, but for example, a metal coating obtained by layering Au (gold), Al (aluminum) or an alloy in which Au (gold) or Al (aluminum) is contained as a main component on a base layer made of Cr (chrome), Ni (nickel) or the like may be used.

Hereinbefore, a basic configuration of the resonator element 1 has been described. Next, the appearance of the resonator element 1 will be described in detail. The size of each section in the following description becomes a particularly effective value when the appearance (length L and width W) of the resonator element 1 is in a predetermined range. The predetermined range is a range that satisfies the relationship of L≤5 mm and the relationship of W≤3 mm.

As shown in FIGS. 1 and 2, a first inclined outer edge section (first outer edge section) 26 that is inclined with respect to both of the X axis direction and the Z' axis direction is provided in a connecting section (corner section) where the second thick section 24 and the third thick section 25 are connected to each other, in the plan view. The first inclined outer edge section 26 is provided so that the corner section positioned on the −X axis side and the +Z' axis side is cut. By providing the first inclined outer edge section 26, it is possible to reduce the mass of the resonator element 1 on the tip side. Thus, as shown in FIG. 4, in a state where the resonator element 1 is fixed to the target through the adhesive material in the mounting section 29, it is possible to reduce the amount of deformation (of the vibrating section 21) on the tip side of the resonator element 1 when an angular velocity in the Y' axis direction is applied to the resonator element 1. As a result, it is possible to reduce change in a vibration characteristic (frequency) due to an acceleration in the Y' axis direction, and to abate sensitivity of the resonator element 1 to the acceleration in the Y' axis direction. Accordingly, the resonator element 1 can achieve a stable vibration characteristic regardless of whether the acceleration in the Y' axis direction is applied. In particular, in the present embodiment, by removing the thick section 22 positioned at the corner section on the −X axis side and the +Z' axis side, it is possible to more effectively achieve the mass reduction effect. Further, according to the resonator element 1, since it is possible to sufficiently abate the sensitivity of the resonator element 1 to the acceleration in the Y' axis direction, for example, it is not necessary to excessively increase the thickness of the thick section 22 to increase the rigidity, thereby preventing an increase in the size of the resonator element 1.

Here, an inclination angle θ1 of the first inclined outer edge section 26 with respect to the X axis is not particularly limited, but is preferably 30° or more and 60° or less. Thus, it is possible to more effectively achieve the mass reduction effect. In the present embodiment, the angle is about 45°. Further, according to the present embodiment, the first inclined outer edge section 26 is provided so that the second thick section 24 and the third thick section 25 are not disconnected. Thus, it is possible to prevent an unintentional reduction of the rigidity of the resonator element 1. If the second and third thick sections 24 and 25 are disconnected due to the first inclined outer edge section 26, the second thick section 24 mainly functions as a weight of the tip section, and thus, the amount of deformation of the vibrating section 21 in the Y' axis direction increases in association with the rigidity reduction of the resonator element 1.

A change in a G sensitivity characteristic (standardized G sensitivity) due to a change in the size of the first inclined outer edge section 26 when an acceleration is applied in the Y' axis direction is shown in a graph of FIG. 5. In FIG. 5, a length L1 shown in FIG. 2 represents the size of the first inclined outer edge section 26. Further, the standardized G sensitivity may be expressed by the following expressions. This means that the sensitivity to the acceleration in the Y' axis direction is abated as the standardized G sensitivity decreases, compared with a comparative example (this is similarly applied hereinafter). As the comparative example, as shown in FIG. 10A, a structure in which the first inclined outer edge section 26 is not provided (L1=0) is used.

$$G \text{ sensitivity (ppm)} = \frac{(\text{vibration frequency} - \text{state frequency})}{\text{static frequency}} \times 10^6$$

$$\text{Standardized } G \text{ sensitivity} = \frac{G \text{ sensitivity in the invention}}{G \text{ sensitivity in the comparative example}}$$

As shown in FIG. 5, it can be understood that the frequency change decreases and the sensitivity to the acceleration in the Y' axis direction is abated as the size of the first inclined outer edge section 26 increases. FIG. 5 is a graph illustrating the tendency of the resonator element 1 as an example, and thus, the resonator element 1 is not limited to the numerical values shown in FIG. 5.

Next, a thickness T of the thick section 22 (length in the Y' axis direction), a width $W_{24}$ of the second thick section 24 (length in the X axis direction) and a width $W_{25}$ of the third thick section 25 (length in the Z' axis direction) in the resonator element 1 will be described in detail. Here, the thickness T represents an average thickness of the thick section main bodies 232, 242 and 252 of the thick section 22, the width $W_{24}$ represents an average width of the thick section main body 242, and the width $W_{25}$ represents an average width of the thick section main body 252.

First, the width $W_{24}$ of the thick section main body 242 will be described. It is preferable that the width $W_{24}$ is set to 100 μm or less. Thus, it is possible to sufficiently reduce the mass of the second thick section 24, to reduce the mass of the resonator element 1 on the tip side. Thus, it is possible to reduce change in a vibration characteristic due to the acceleration in the Y' axis direction, and to obtain the resonator element 1 capable of achieving a stable vibration characteristic regardless of whether the acceleration in the Y' axis direction is applied.

Change in a G sensitivity characteristic (standardized G sensitivity) due to change in the width $W_{24}$ when an acceleration is applied in the Y' axis direction is shown in a graph of FIG. 6. As shown in FIG. 6, it can be understood that a frequency change decreases and sensitivity to the acceleration in the Y' axis direction is abated as the width $W_{24}$ decreases. Further, difference in the amount of deformation when acceleration loads of two resonator elements having different widths $W_{24}$ are applied in the -Y' axis direction is shown in FIG. 7. In FIG. 7, the width $W_{24}$ of the resonator element indicated by a solid line is set to be smaller than the width $W_{24}$ of the resonator element indicated by a dashed line, and the resonator element indicated by the solid line has a small amount of deformation. Thus, it can be understood that the sensitivity of the resonator element 1 having the small width $W_{24}$ to the acceleration in the Y' axis direction is abated. FIGS. 6 and 7 are graphs respectively illustrating the tendency of the resonator element 1 as an example, and thus, the resonator element 1 is not limited to the numerical values shown in FIGS. 6 and 7.

Here, from the viewpoint of the mass reduction effect of the tip section of the resonator element 1, the small width $W_{24}$ is preferable. However, if the width $W_{24}$ is excessively small, the strength of the resonator element 1 may be excessively reduced depending on the thickness T of the thick section 22, which may cause damage to the resonator element 1. Thus, from the viewpoint of securing a mechanical strength of the resonator element 1, it is preferable that the width $W_{24}$ be 40 μm or greater. That is, by satisfying the relationship of 40 μm≤$W_{24}$≤100 μm, it is possible to reduce the mass of the tip section of the resonator element 1 while securing the mechanical strength of the resonator element 1. Thus, it is possible to decrease the amount of deformation of the resonator element 1 on the tip side when an angular velocity in the Y' axis direction is applied to the resonator element 1, and thus, the resonator element 1 can achieve a stable vibration characteristic regardless of whether the acceleration in the Y' axis direction is applied. Further, by satisfying the relationship of 45 μm≤$W_{24}$≤55 μm, it is possible to remarkably achieve the above-described effects.

Next, the thickness T of the thick section 22 will be described. The thickness T is not particularly limited, but it is preferable to satisfy the relationship of 50 μm≤T≤70 μm. Thus, it is possible to form the vibrating section 21 with high accuracy while securing the rigidity of the resonator element 1. Thus, the resonator element 1 can stably achieve a desired vibration characteristic. On the other hand, if the thickness T is smaller than the lower limit value, the rigidity of the resonator element 1 may become insufficient depending on the mass (the length L, the width W and the like) of the resonator element 1, and thus, it may be difficult to sufficiently reduce the amount of deformation of the tip section (vibrating section 21) of the resonator element 1 when the angular velocity in the Y' axis direction is applied to the resonator element 1. In contrast, if the thickness T exceeds the upper limit value, the size of the resonator element 1 may excessively become large, or the yield of the resonator element 1 may be reduced. Specifically, as described above, the vibrating section 21 is obtained by forming the recessed section on the main surface on the +Y' side by wet etching. Here, if the thickness T increases, the recessed section becomes deep. Accordingly, the widths of the inclined sections 231, 241 and 251 increase. Thus, the size of the resonator element 1 increases. Further, if the thickness T increases, the depth (etching depth) of the recessed section becomes deep, which degrades the etching accuracy. Thus, it is difficult to adjust the vibrating section 21 to a desired thickness, and thus, the yield of the resonator element is reduced.

The change in the G sensitivity characteristic due to the change in the thickness T when the acceleration in the Y' axis direction is applied is shown in a graph of FIG. 8. As shown in FIG. 8, it can be understood that the frequency change decreases and the sensitivity to the acceleration in the Y' axis direction is abated as the thickness T increases. FIG. 8 shows results from four samples every thickness T. Further, FIG. 8 is a graph illustrating the tendency of the resonator element 1 as an example, and thus, the resonator element 1 is not limited to the numerical values shown in FIG. 8.

Next, the width $W_{25}$ of the thick section main body 252 will be described. The width $W_{25}$ is not particularly limited, but is preferably set to 200 μm or greater. Thus, it is possible to sufficiently secure the rigidity of the resonator element 1, and to reduce the amount of deformation of the resonator element 1 on the tip side (vibrating section 21) when an angular velocity in the Y' axis direction is applied to the resonator element 1. Accordingly, the resonator element 1 can achieve a stable vibration characteristic regardless of whether the acceleration in the Y' axis direction is applied. In particular, in the resonator element 1, since the first thick section 23 supports the vibrating section 21 in the X axis direction and the third thick section 25 supports the vibrating section 21 in the Z' axis direction, it is possible to more effectively suppress the deformation of the vibrating section 21 in the Y' axis direction. The upper limit value of the width $W_{25}$ is not particularly limited, but as long as the vibrating section 21 can be formed with a desired size, it is preferable that the upper limit be large. Thus, it is possible to more remarkably achieve the above-described effects.

Change in the G sensitivity characteristic (standardized G sensitivity) due to change in the width $W_{25}$ when an acceleration is applied in the Y' axis direction is shown in a graph of FIG. 9. As shown in FIG. 9, it can be understood that the frequency change decreases and the sensitivity to the acceleration in the Y' axis direction is abated as the width $W_{25}$ increases. FIG. 9 is a graph illustrating the tendency of the resonator element 1 as an example, and thus, the resonator element 1 is not limited to the numerical values shown in FIG. 9.

As described above, according to the resonator element 1 of the present embodiment, it is possible to reduce the mass on the tip side, and to reduce the change in the vibration characteristic due to the acceleration applied in the Y' axis direction, thereby achieving a stable vibration characteristic.

Figure 10B:
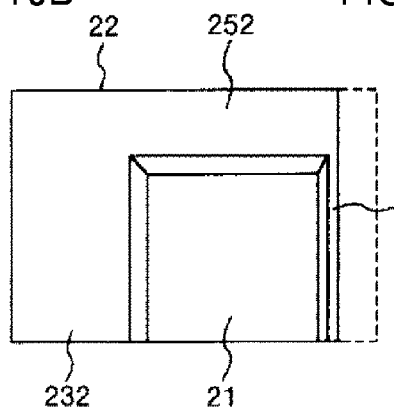
Figure 10D:
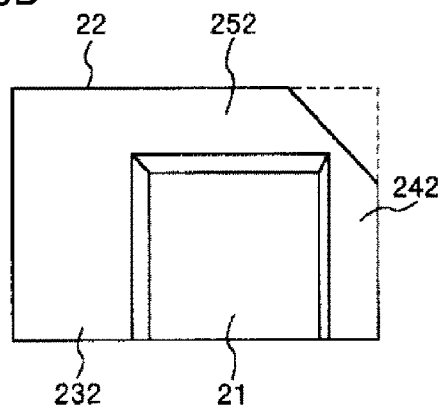
Figure 10C:
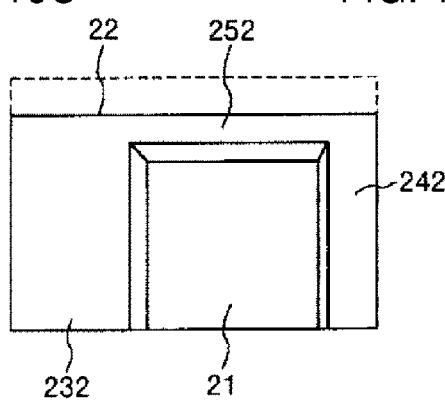
Figure 10E:
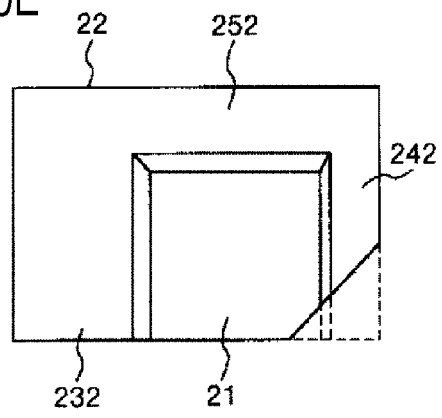

Here, in order to reduce the mass of the tip section of the resonator element that is the comparative example shown in FIG. 10A, as shown in FIG. 10B, the width of the thick section main body 242 may be reduced, as shown in FIG. 10C, the width of the thick section main body 252 may be reduced, as shown in FIG. 10D, a corner section of the tip section on the +Z' axis side may be removed, or as shown in FIG. 10E, a corner section of the tip section on the −Z' axis side may be removed. Hereinafter, a pattern shown in FIG. 10B is referred to as a pattern P1, a pattern shown in FIG. 10C is referred to as a pattern P2, a pattern shown in FIG. 10D is referred to as a pattern P3, and a pattern shown in FIG. 10E is referred to as a pattern P4.

Influences of the respective patterns P1 to P4 on the G sensitivity characteristic are shown in FIG. 11. The horizontal axis in the graph of FIG. 11 represents a value of [mass of a removed section (section surrounded by a dashed line)]×[separation distance between the center of gravity of the removed section and a fulcrum (mounting section 29)], which is referred to as a "moment" hereinafter. The vertical axis in the graph of FIG. 11 represents a standardized G sensitivity, which is a value obtained by standardizing a G sensitivity of each of the patterns P1 to P4 when the G sensitivity of the resonator element that is the comparative example shown in FIG. 10A is set to "1".

It can be understood from FIG. 11 that changes in the G sensitivity characteristics are different in the patterns P1 to P4. For example, the G sensitivity decreases as the removed section is enlarged in the patterns P1, P3 and P4, whereas the G sensitivity increases as the removed section is enlarged in the pattern P2. Further, in the patterns P1, P3 and P4, the G sensitivity linearly decreases in proportion to the size of the removed section without being saturated in the patterns P1 and P3, whereas the decrease of the G sensitivity is almost saturated if the size of the removed section is a predetermined value or greater in the pattern P4. It is considered that the difference between the G sensitivity characteristic changes of the patterns P1 to P4 is caused due to the crystal axes of the quartz crystal and the shape of the resonator element.

FIG. 12 is a graph illustrating the relationship of a resonance frequency due to a force F applied to a quartz crystal resonator and displacement. When an intersection angle between the force F and the X axis of the quartz crystal is ψ, if ψ=0°, the force F acts along the X axis direction, and if ψ=90°, the force F acts along the Z' axis direction.

Further, it can be understood from FIG. 12 that a stress sensitivity (Kf) is reversed in positivity and negativity between the X axis and the Z' axis. It is considered that this reversion is a factor that causes the difference between the pattern P1 and the pattern P2. Further, since it is considered that each of the patterns P3 and P4 is a combination of the patterns p1 and P2, it is considered that the patterns P3 and P4 show different characteristics from those of the patterns P1 and P2. Further, it is considered that the difference between the patterns P3 and P4 is also caused due to the difference between the shapes of the resonator element 1, in addition to the stress sensitivity. That is, in the pattern P3, since the thick section 22 occupies the entirety of the removed section regardless of the size of the removed section, the G sensitivity is linearly abated according to the size of the removed section. On the other hand, in the pattern P4, the ratio of the vibrating section 21 occupied in the removed section increases as the removed section is enlarged, the mass reduction effect is reduced, and the decrease of the G sensitivity is saturated.

In this way, the present inventors found that it is possible to select a method of changing the G sensitivity based on the reduction in the mass of the tip section of the resonator element. In the resonator element 1, by selecting the pattern P3 from among the patterns P1 to P4, it is possible to reduce the mass of the tip section and to improve the G sensitivity characteristic. The pattern P3 is preferable in that the G sensitivity linearly decreases without saturation. Further, for example, compared with the pattern P1 that is common to the pattern P3 in that the G sensitivity linearly decreases without saturation, the decreasing rate of the G sensitivity is large, which is more preferable. Further, as described above, by reducing the width $W_{24}$, it is possible to add the effect of the pattern P1 to the effect of the pattern P3. The pattern P1 is preferable in that the G sensitivity linearly decreases without saturation. Further, the pattern P1 is also preferable in that it is possible to reduce the length of the vibrating element 1 in the X axis direction and to reduce the size thereof, compared with the other patterns P2 to P4. Further, as described above, by increasing the width $W_{25}$, it is possible to suppress the occurrence of the effect of the pattern P2, and to suppress the increase in the G sensitivity.

Second Embodiment

Next, a second embodiment of a resonator element according to the invention will be described.

Figure 13:
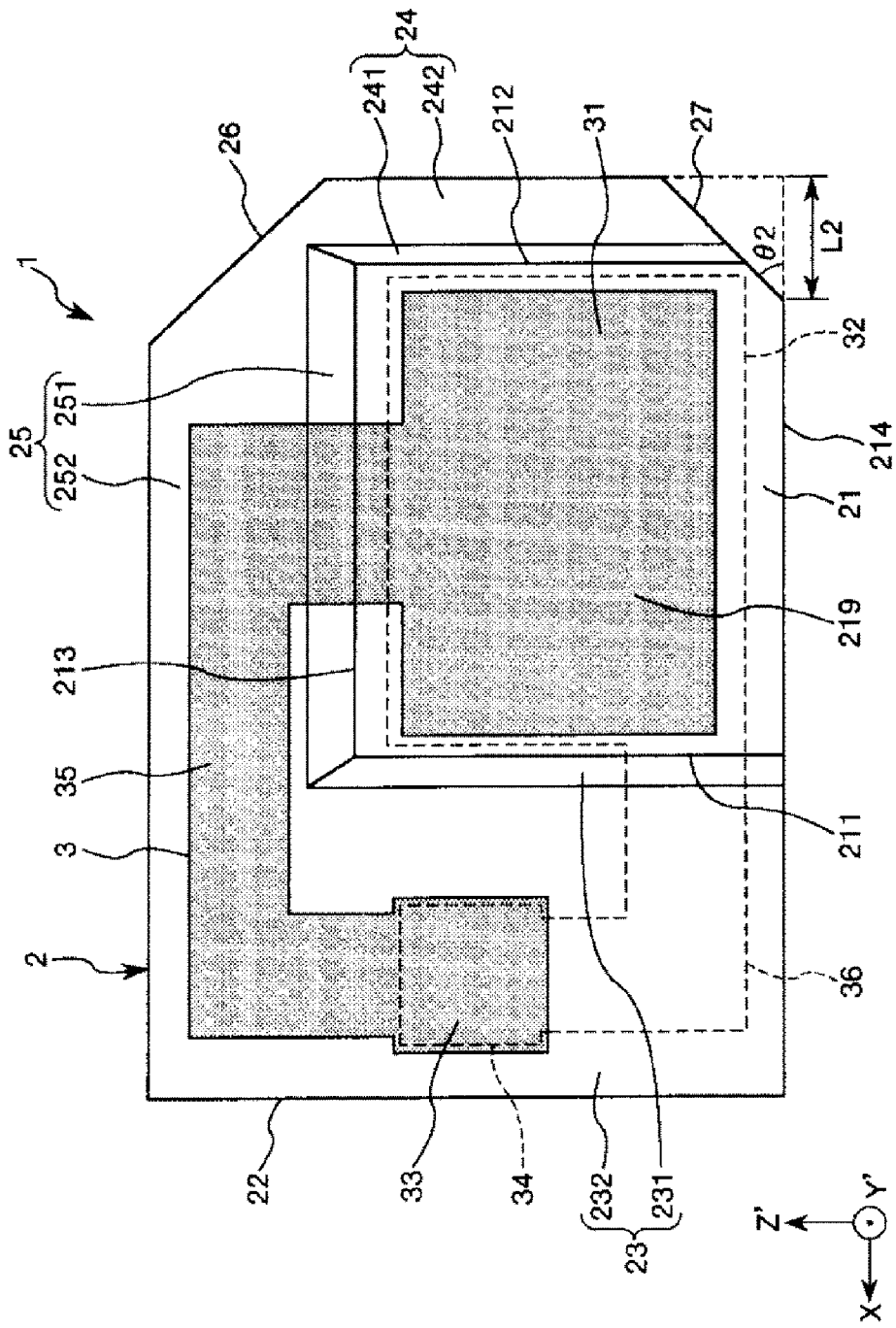
FIG. 13 is a plan view illustrating a resonator element according to a second embodiment of the invention.
Figure 14:
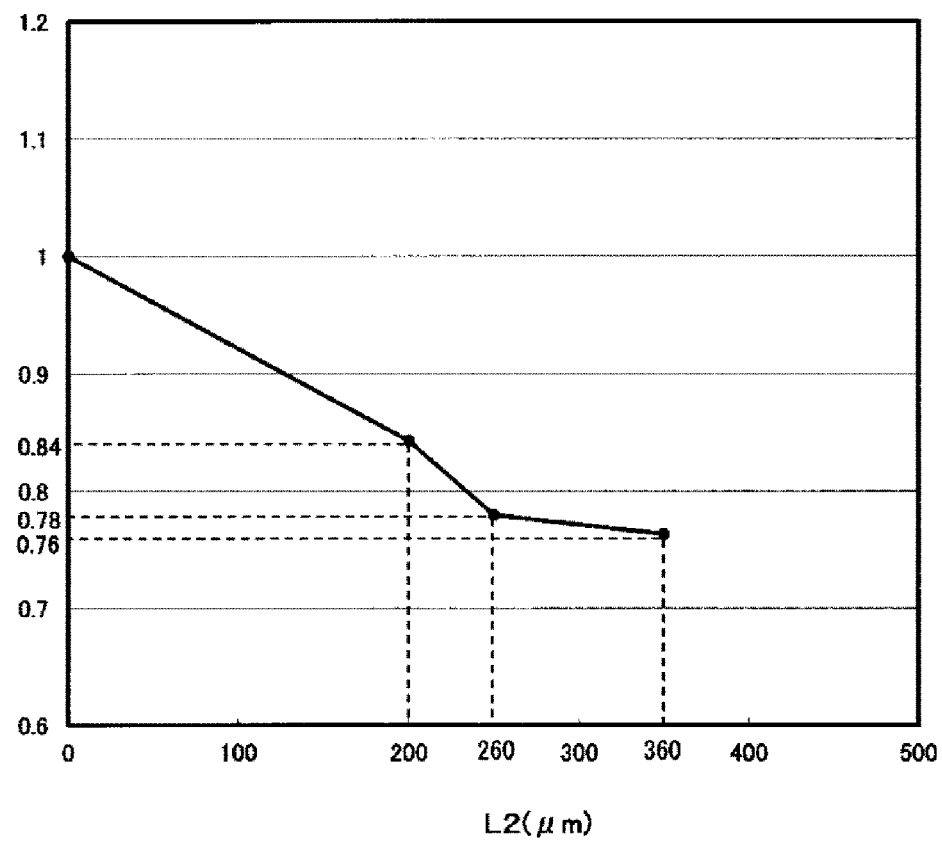
FIG. 14 is a graph illustrating the relationship between the size of a second inclined outer edge section and G sensitivity.
Figure 15:
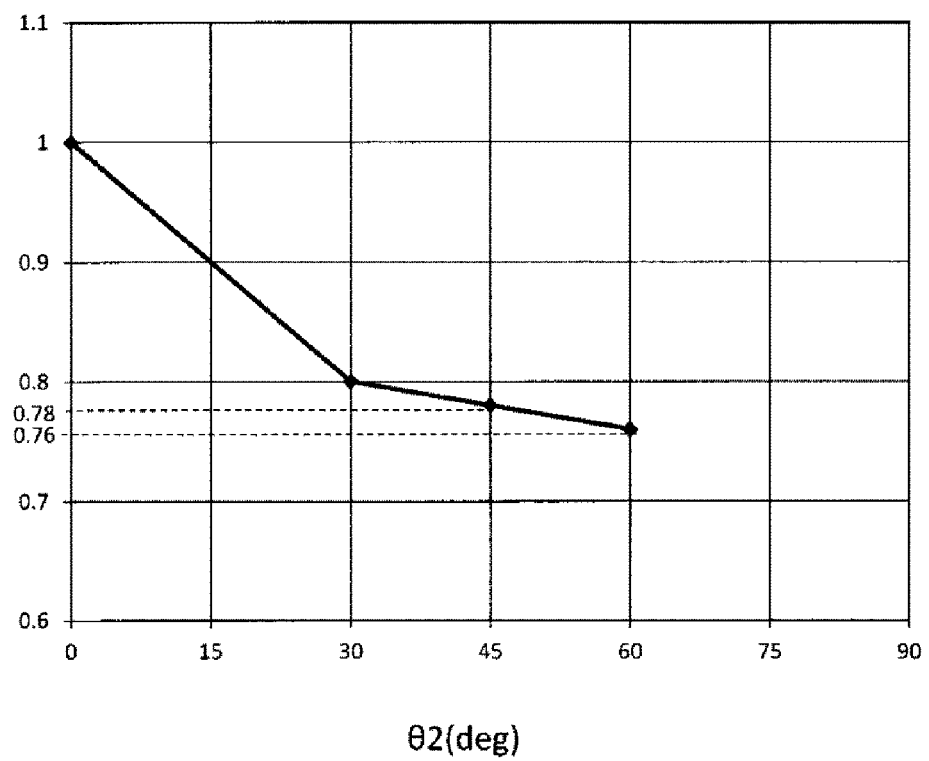
FIG. 15 is a graph illustrating the relationship between an angle θ2 and G sensitivity.

FIG. 13 is a plan view of the resonator element according to the second embodiment of the invention. FIG. 14 is a graph illustrating the relationship between the size of a second inclined outer edge section and G sensitivity. FIG. 15 is a graph illustrating the relationship between an angle 82 and G sensitivity.

Hereinafter, differences between the resonator element of the second embodiment and the resonator element of the first embodiment will be mainly described, and description regarding the same content will not be repeated.

The resonator element according to the second embodiment of the invention is the same as that of the first embodiment, except for the configuration of the piezoelectric substrate. The same components as in the first embodiment are given the same reference numerals.

As shown in FIG. 13, in the resonator element 1 of the present embodiment, a second inclined outer edge section (second outer edge section) 27 that is inclined with respect to both of the X axis direction and the Z' axis direction is provided in an end section of the second thick section 24 in the −Z' axis side (a side opposite to the third thick section 25), in the plan view. The second inclined outer edge section 27 is provided so that the corner section positioned on the −X axis side and the −Z' axis side is cut. By providing the second inclined outer edge section 27, it is possible to further reduce the mass of the resonator element 1 on the tip side, from the above-described first embodiment. Thus, it is possible to further abate sensitivity of the resonator element 1 to the acceleration in the Y' axis direction, and to obtain the resonator element 1 capable of achieving a stable vibration characteristic regardless of whether the acceleration in the Y' axis direction is applied.

Here, the angle (inclination angle) θ2 of the second inclined outer edge section 27 with respect to the X axis is not particularly limited, but is preferably 30° or more and 60° or less. As understood from FIG. 15, in this range, the frequency change is sufficiently reduced, and the sensitivity to the acceleration in the Y' axis direction is abated. Further, in this range, it is possible to more effectively achieve the mass reduction effect. If the angle exceeds 60°, the sensitivity to the acceleration in the Y' axis direction is approximately saturated, and it is difficult to further improve the effect. Further, the size of the vibrating section 21 is noticeably reduced, which may cause a disadvantage.

Further, it is preferable that the second inclined outer edge section 27 be provided over the vibrating section 21. Thus, it is possible to increase the size of the second inclined outer edge section 27, to thereby remarkably achieve the above-mentioned effect.

Change in a G sensitivity characteristic due to difference in the size of the second inclined outer edge section 27 when an acceleration is applied in the Y' axis direction is shown in a graph of FIG. 14. In FIG. 14, a length L2 shown in FIG. 13 represents the size of the second inclined outer edge section 27. As shown in FIG. 14, it can be understood that the frequency change decreases and the sensitivity to the acceleration in the Y' axis direction is abated as the size of the second inclined outer edge section 27 increases. FIG. 14 is a graph illustrating the tendency of the resonator element 1 as an example, and thus, the resonator element 1 is not limited to the numerical values shown in FIG. 14.

As described above, in the resonator element 1 of the present embodiment, by selecting the patterns P3 and P4, it is possible to reduce the mass of the tip section, and to enhance the G sensitivity characteristic. As understood from FIG. 11, the pattern P4 among the patterns P1 to P4 is highest in the initial G sensitivity decrease effect. Thus, by adding the pattern P4 to the selection, it is possible to more effectively abate the sensitivity of the resonator element 1 to the acceleration in the Y' axis direction. Accordingly, it is possible to obtain the resonator element 1 capable of achieving a stable vibration characteristic regardless of whether the acceleration in the Y' axis direction is applied. As described above, in the pattern P4, there is a saturation point of the G sensitivity decrease effect. Thus, it is preferable that the second inclined outer edge section 27 is designed so that the moment comes close to the saturation point. According to this design, it is possible to maximize the effect of the pattern P4, and to prevent an excessive increase of the size of the second inclined outer edge section 27.

According to the second embodiment, it is possible to achieve the same effect as in the first embodiment.

Third Embodiment

Next, a third embodiment of the resonator element according to the invention will be described.

Figure 16:
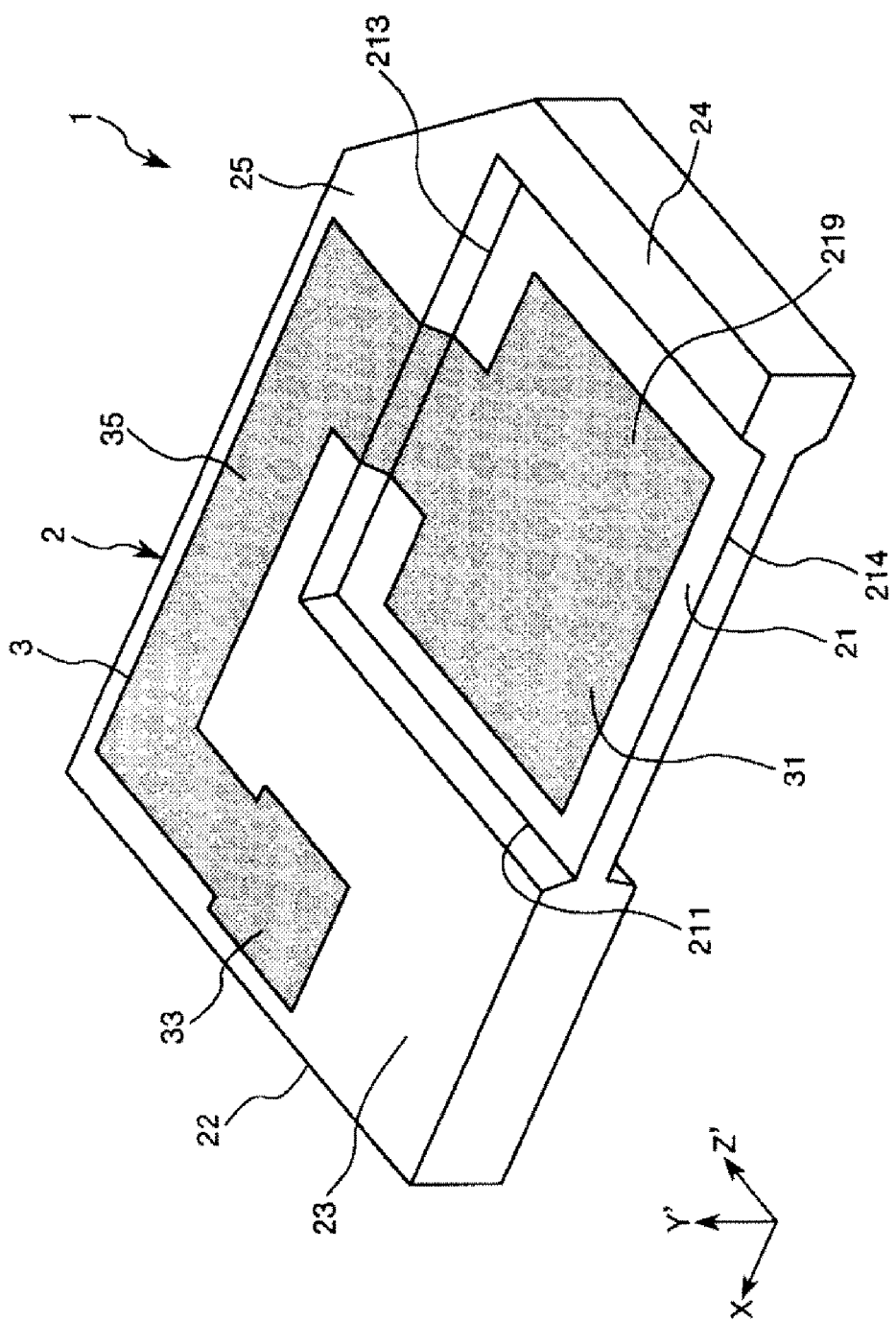
FIG. 16 is a perspective view illustrating a resonator element according to a third embodiment of the invention.

FIG. 16 is a perspective view illustrating the resonator element according to the third embodiment of the invention.

Hereinafter, differences between the resonator element of the third embodiment and the resonator element of the first embodiment will be mainly described, and description regarding the same content will not be repeated.

The resonator element according to the third embodiment of the invention is the same as that of the first embodiment, except for the configuration of the piezoelectric substrate. The same components as in the first embodiment are given the same reference numerals.

As shown in FIG. 16, in the resonator element 1 of the present embodiment, by forming recessed sections on both of the main surfaces of the piezoelectric substrate 2, the vibrating section 21 is formed. In other words, the front surface (main surface on the +Y' axis direction side) of the thick section 22 is provided to protrude in the +Y' axis direction with reference to the front surface (main surface on the +Y' axis direction side) of the vibrating section 21, and the rear surface (main surface on the −Y' axis direction side) of the thick section 22 is provided to protrude in the −Y' axis direction with respect to the rear surface (main surface on the −Y' axis direction side) of the vibrating section 21. In this way, by forming the recessed sections on both of the main surfaces of the piezoelectric substrate 2 to form the vibrating section 21, for example, it is possible to reduce the etching depth of the recessed sections, compared with the above-described first embodiment. Thus, it is possible to perform the etching with accuracy, and to obtain the outer shape of the piezoelectric substrate 2 with high accuracy.

According to the third embodiment, it is possible to achieve the same effect as in the first embodiment.

2. Resonator

Next, a resonator (resonator according to the invention) to which the above-described resonator element 1 is applied will be described.

Figure 17:
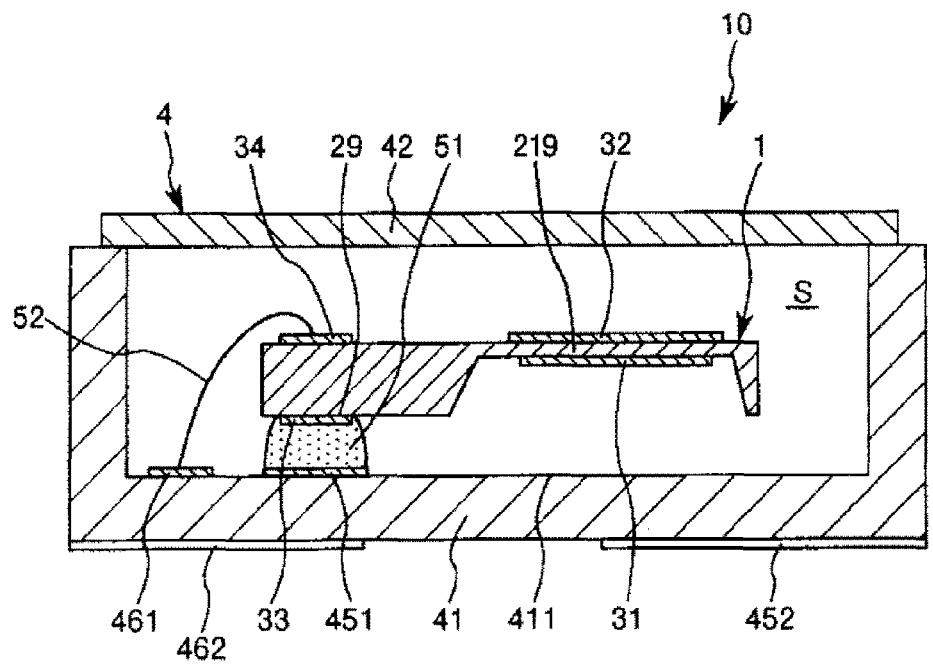
FIG. 17 is a cross-sectional view illustrating an embodiment suitable for a resonator according to the invention.

FIG. 17 is a cross-sectional view illustrating an embodiment suitable for the resonator according to the invention.

A resonator 10 shown in FIG. 17 includes the above-described resonator element 1, and a package 4 that accommodates the resonator element 1.

Package

The package 4 includes abase 41 of a box shape having a recessed section 411 with an opening at an upper surface thereof, and a lid 42 of a plate shape bonded to the base 41 to block the opening of the recessed section 411. Further, the resonator element 1 is accommodated in an accommodating space S formed as the recessed section 411 is blocked by the lid 42. The accommodating space S may be in a decompression (vacuum) state, or may be sealed with an inert gas such as nitrogen, helium or argon.

A component material of the base 41 is not particularly limited, but various ceramics such as aluminum oxide may be used. Further, a component material of the lid 42 is not particularly limited, but a member having a linear expansion coefficient close to that of the component material of the base 41 may be used. For example, when the component material of the base 41 is the above-described ceramics, an alloy such as Kovar may be preferably used. The bonding of the base 41 and the lid 42 is not particularly limited, but for example, may be performed using an adhesive material, or may be performed using seam welding or the like.

On the bottom surface of the recessed section 411 of the base 41, connection electrodes 451 and 461 are formed. Further, on the lower surface of the base 41, outer mounting terminals 452 and 462 are formed. The connection electrode 451 is electrically connected to the outer mounting terminal 452 through a through electrode (not shown) formed in the base 41, and the connection electrode 461 is electrically connected to the outer mounting terminal 462 through a through electrode (not shown) formed in the base 41.

Configurations of the connection electrodes 451 and 461 and the outer mounting terminals 452 and 462 are not particularly limited as long as they have conductivity, respectively. For example, the connection electrodes 451 and 461 and the outer mounting terminals 452 and 462 may be formed by a metal coating obtained by layering a coating made of Ni (nickel), Au (gold), Ag (silver), Cu (copper) or the like on a metalized layer (base layer) made of Cr (chrome), W (tungsten) or the like.

The resonator element 1 accommodated in the accommodating space S is fixed to the base 41 by a conductive adhesive material 51 in the mounting section 29 with the front surface (a first main surface) side of the vibration region 219 thereof being directed toward the base 41 side. The conductive adhesive material 51 is provided in contact with the connection electrode 451 and the pad electrode 33. Thus, the connection electrode 451 and the pad electrode 33 are electrically connected to each other through the conductive adhesive material 51. By supporting the resonator element 1 at one place (one point) using the conductive adhesive material 51, for example, it is possible to suppress stress generated in the resonator element 1 due to the difference between the thermal expansion coefficients of the base 41 and the piezoelectric substrate 2.

The conductive adhesive material 51 is not particularly limited as long as it has conductivity and adhesiveness, but for example, a material obtained by dispersing a conductive filler into an adhesive material of a silicone base, an epoxy base, an acrylic base, a polyimide base, a bismaleimide base or the like may be used.

In the present example, the conductive adhesive material 51 is used, but the invention is not limited thereto. For example, the resonator element 1 may be attached to the base 41 through a bump such as a gold bump, a solder bump or a plating bump formed by plating using a flip chip mounting technology.

The pad electrode 34 of the resonator element 1 is electrically connected to the connection electrode 461 through a bonding wire 52. As described above, since the pad electrode 34 is disposed to face the pad electrode 33, in a state where the resonator element 1 is fixed to the base 41, the pad electrode 34 is disposed directly above the conductive adhesive material 51. Thus, it is possible to suppress leakage of vibration (ultrasonic vibration) given to the pad electrode 34 in wire bonding, and to reliably perform the connection of the bonding wire 52 to the pad electrode 34.

3. Oscillator

Next, an oscillator (oscillator according to the invention) to which the resonator element according to the invention is applied will be described.

Figure 18:
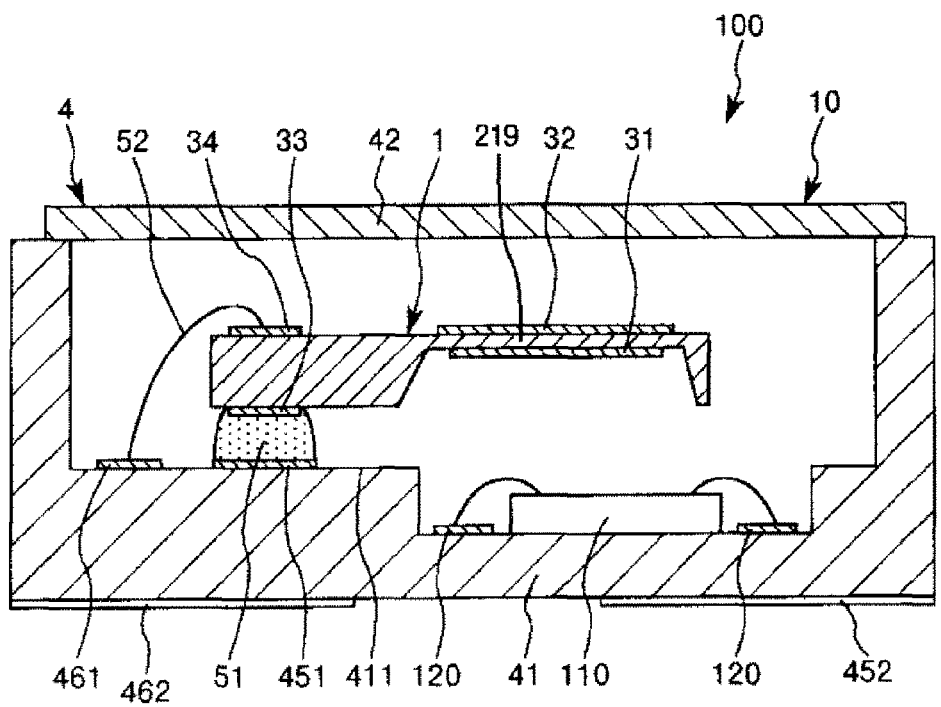
FIG. 18 is a cross-sectional view illustrating an embodiment suitable for an oscillator according to the invention.

FIG. 18 is a cross-sectional view illustrating an embodiment suitable for the oscillator according to the invention.

An oscillator 100 shown in FIG. 18 includes the resonator 10, and an IC chip 110 for driving the resonator element 1. Hereinafter, differences between the oscillator 100 and the above-described resonator will be mainly described, and description regarding the same content will not be repeated.

As shown in FIG. 18, in the oscillator 100, the IC chip 110 is fixed to the recessed section 411 of the base 41. The IC chip 110 is electrically connected to plural internal terminals 120 formed on the bottom surface of the recessed section 411. A part of the plural internal terminals 120 is connected to the connection electrodes 451 and 461, and the remaining part thereof are connected to the outer mounting terminals 452 and 462. The IC chip 110 has an oscillation circuit for performing a drive control of the resonator element 1. If the resonator element 1 is driven by the IC chip 110, it is possible to extract a signal of a predetermined frequency.

4. Electronic Apparatus

Next, an electronic apparatus (electronic apparatus according to the invention) to which the resonator element according to the invention is applied will be described.

Figure 19:
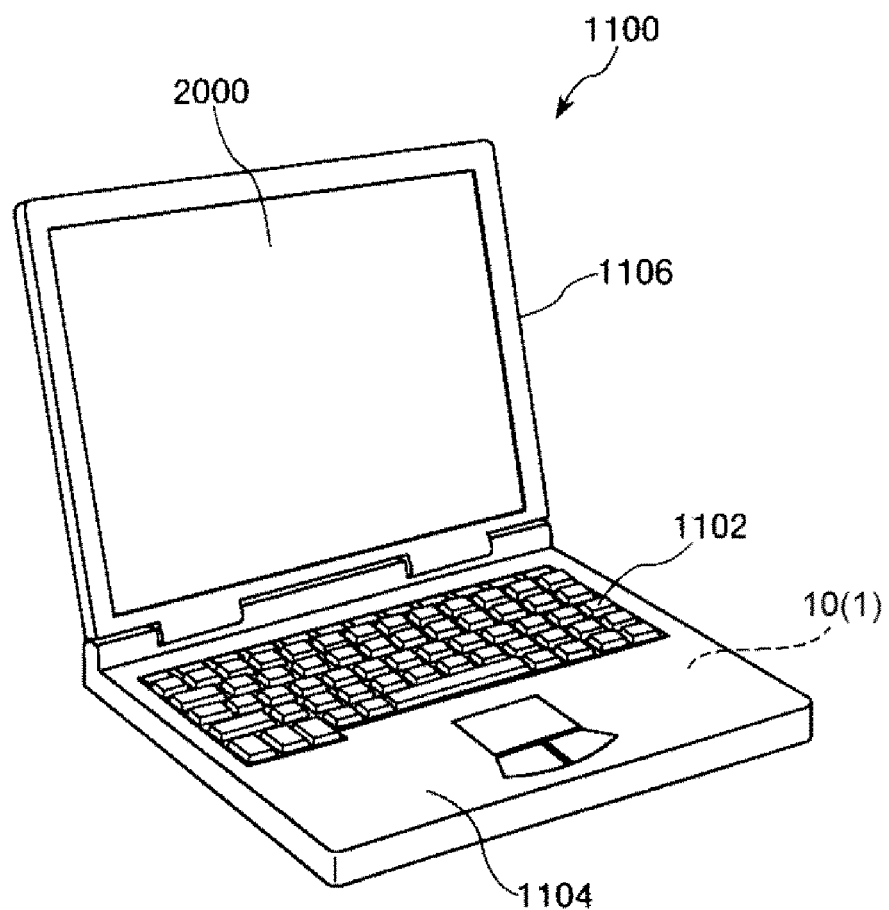
FIG. 19 is a perspective view illustrating a configuration of a mobile (or note-type) personal computer to which an electronic apparatus according to the invention is applied.

FIG. 19 is a perspective view illustrating a configuration of a mobile (or note-type) personal computer to which the electronic apparatus according to the invention is applied. In FIG. 19, a personal computer 1100 includes a main body section 1104 provided with a keyboard 1102, and a display unit 1106 provided with a display section 2000. The display unit 1106 is supported to the main body section 1104 to be rotatable through a hinge structure. The resonator 10 (resonator element 1) that functions as a filter, a resonator, a reference clock or the like is built into the personal computer 1100.

Figure 20:
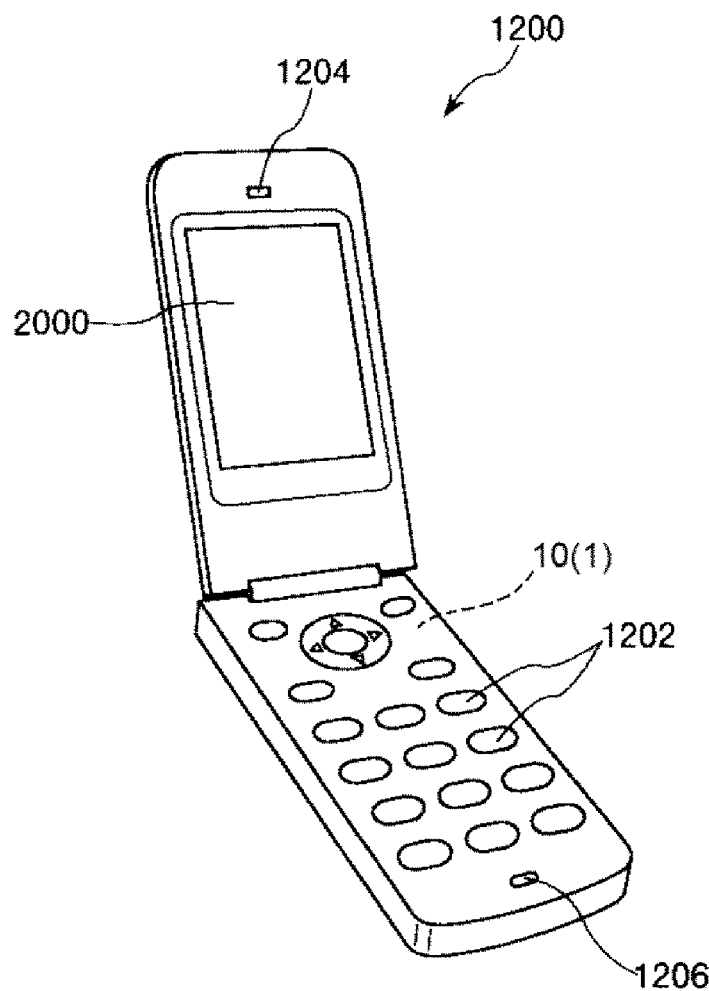
FIG. 20 is a perspective view illustrating a configuration of a mobile phone (including a PHS) to which an electronic apparatus according to the invention is applied.

FIG. 20 is a perspective view illustrating a configuration of a mobile phone (including a PHS) to which the electronic apparatus according to the invention is applied. In FIG. 20, a mobile phone 1200 includes plural operation buttons 1202, an ear piece 1204 and a mouthpiece 1206, and a display section 2000 is disposed between the operation buttons 1202 and the ear piece 1204. The resonator 10 (resonator element 1) that functions as a filter, a resonator, a reference clock or the like is built into the mobile phone 1200.

Figure 21:
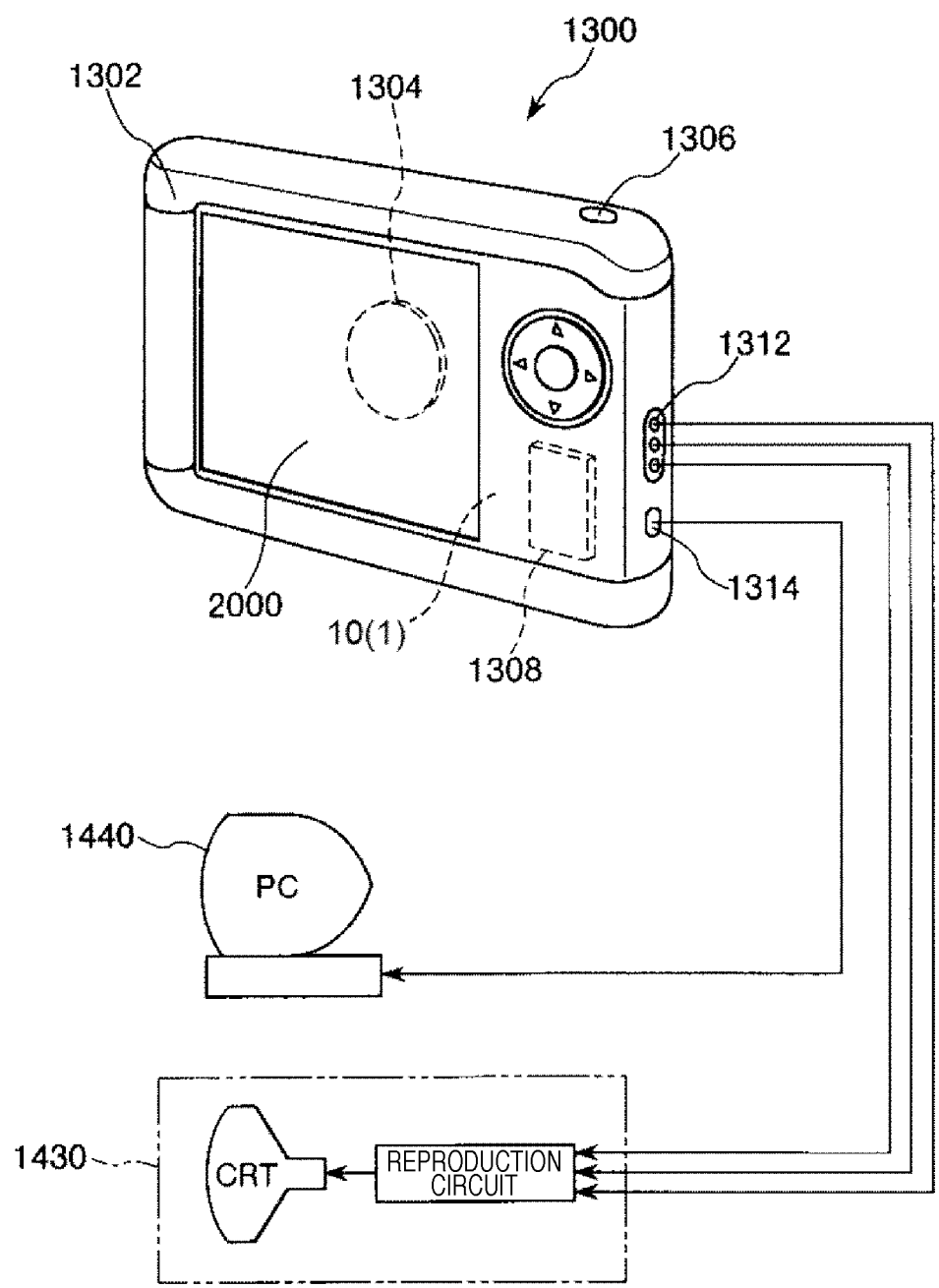
FIG. 21 is a perspective view illustrating a configuration of a digital still camera to which an electronic apparatus according to the invention is applied.

FIG. 21 is a perspective view illustrating a configuration of a digital still camera to which the electronic apparatus according to the invention is applied. In FIG. 21, connection to an external device is also simply shown. Here, an ordinary camera has a configuration in which a silver salt photo film is exposed to a light image of an object, whereas a digital still camera 1300 has a configuration in which a light image of an object is photoelectrically converted by an imaging element such as a charged coupled device (CCD) to generate an imaging signal (image signal).

A display section is provided on a rear surface of a case (body) 1302 in the digital still camera 1300 to perform display based on the imaging signal obtained by the CCD. The display section functions as a finder that displays the object as an electronic image. Further, a light receiving unit 1304 that includes an optical lens (imaging optical system), the CCD or the like is provided on a front surface side (rear surface side in the figure) of the case 1302.

If a user checks an object image displayed in the display section and presses a shutter button 1306, an imaging signal of the CCD at that time is transmitted to and stored in a memory 1308. Further, in the digital still camera 1300, a video signal output terminal 1312, and a data communication input/output terminal 1314 are provided on a side surface of the case 1302. Further, as shown in the figure, a television monitor 1430 is connected to the video signal output terminal 1312, and a personal computer 1440 is connected to the data communication input/output terminal 1314, as necessary. Further, the imaging signal stored in the memory 1308 is output to the television monitor 1430 or the personal computer 1440 by a predetermined operation. The resonator 10 (resonator element 1) that functions as a filter, a resonator, a reference clock or the like is built into the digital still camera 1300.

The electronic apparatus provided with the resonator element according to the invention may be applied to an ink jet discharge device (for example, an ink jet printer), a laptop personal computer, a television, a video camera, a video tape recorder, a car navigation device, a pager, an electronic organizer (including the one having a communication function), an electronic dictionary, a calculator, an electronic game machine, a word processor, a work station, a television phone, a crime prevention TV monitor, electronic binoculars, a POS terminal, a medical device (for example, an electronic thermometer, a blood manometer, a blood sugar level meter, an electrocardiographic measuring device, an ultrasonic diagnostic device or an electronic endoscope), a fish-finder, a variety of measuring devices, a meter (for example, a meter for a vehicle, an airplane or a ship), a flight simulator or the like, for example, in addition to the personal computer (mobile personal computer) shown in FIG. 19, the mobile phone shown in FIG. 20 and the digital still camera shown in FIG. 21.

5. Moving Object

Next, a moving object (moving object according to the invention) to which the resonator element according to the invention is applied will be described.

Figure 22:
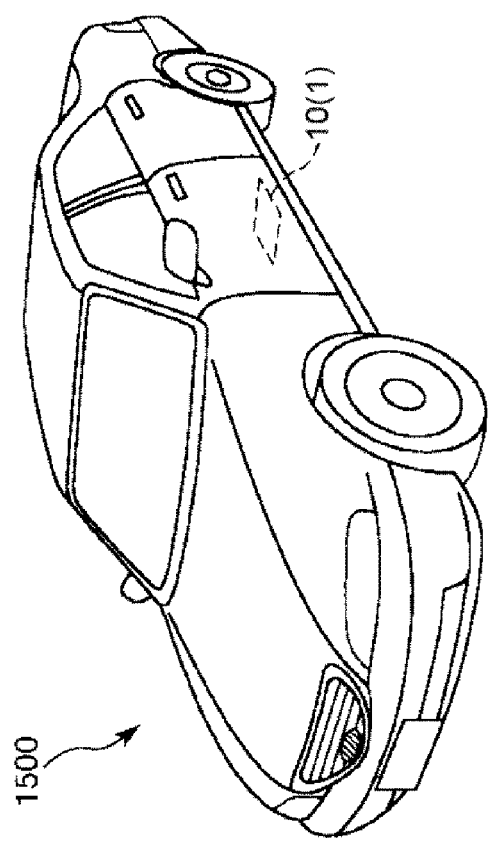
FIG. 22 is a perspective view schematically illustrating an automobile that is an example of a moving object according to the invention.

FIG. 22 is a perspective view schematically illustrating an automobile that is an example of the moving object according to the invention. The resonator 10 (resonator element 1) is mounted in an automobile 1500. The resonator 10 may be widely applied to an electronic control unit (ECU) such as a keyless entry, an immobilizer, a car navigation system, a car air-conditioner, an anti-lock braking system (ABS), an air bag, a tire pressure monitoring system (TPMS), an engine controller, a battery monitor of a hybrid automobile or an electric car, or a vehicle attitude control system.

Hereinbefore, the resonator element, the resonator, the oscillator, the electronic apparatus and the moving object according to the invention have been described with reference to the embodiments shown in the drawings, but the invention is not limited thereto. The configurations of the respective sections may be replaced with arbitrary configurations having the same functions. Further, other arbitrary configurations may be added to the invention. Further, the above-described embodiments may be appropriately combined.

Further, in the above-described embodiments, the quartz crystal substrate is used as the piezoelectric substrate, but for example, various piezoelectric substrates made of lithium niobate (LiNbO$_3$), lithium tantalite (LiTaO$_3$), lead zirconate titanate (PZT), lithium tetraborate (Li$_2$B$_4$O$_7$), langasite (La$_3$Ga$_5$SiO$_{14}$) or the like may be used.

The entire disclosures of Japanese Patent Application No. 2013-075015, filed Mar. 29, 2013, and Japanese Patent Application No. 2014-016245, filed Jan. 30, 2014 are expressly incorporated by reference herein.

What is claimed is:

1. A resonator element comprising:
   a substrate that includes a first region having a vibration region that vibrates with a thickness shear vibration, and a second region that is integrated with the first region and has a thickness larger than that of the first region; and
   excitation electrodes that are respectively provided on a first main surface and a second main surface that are front and rear surfaces of the vibration region,
   wherein the first region includes
      first and second outer edges that are provided to be spaced apart from each other in a vibration direction of the thickness shear vibration and intersect with the vibration direction, and
      third and fourth outer edges that are provided to be spaced apart from each other in a direction that is orthogonal to the vibration direction,
   wherein the second region includes
      a first thick section that is provided along the first outer edge and is provided with a fixing section to be fixed to a target,
      a second thick section that is provided along the second outer edge, and
      a third thick section that is provided along the third outer edge and is connected to the first thick section and the second thick section, and
   wherein when an electrical axis, a mechanical axis and an optical axis that are crystal axes of a quartz crystal are respectively represented as an X axis, a Y axis and a Z axis, and when an axis obtained by inclining the Z axis so that a +Z side is rotated in a −Y direction of the Y axis is represented as a Z' axis and an axis obtained by inclining the Y axis so that a +Y side is rotated in a +Z direction of the Z axis is represented as a Y' axis, using the X axis as a rotation axis, the substrate is a quartz crystal plate in which a surface including the X axis and the Z' axis corresponds to a main surface and a direction of the Y' axis corresponds to a thickness,
   wherein a first outer edge section that intersects with the vibration direction and the direction that is orthogonal to the vibration direction and inclined with respect to the X axis is provided in a connecting section where the second thick section and the third thick section of the substrate are connected and cut out a corner section, in a plan view.

2. The resonator element according to claim 1,
   wherein the first outer edge section is a first inclined outer edge section that is inclined with respect to the vibration direction and the direction that is orthogonal to the vibration direction, in the plan view, and
   wherein an inclination angle of the first inclined outer edge section with respect to the vibration direction is 30° or greater and 60° or less.

3. The resonator element according to claim 1,
   wherein the length of the second thick section in the vibration direction is 40 μm or greater and 100 μm or less.

4. The resonator element according to claim 1,
   wherein the thickness of the second region is 50 μm or greater and 70 μm or less.

5. The resonator element according to claim 1,
   wherein the length of the third thick section in the direction that is orthogonal to the vibration direction is 200 μm or greater.

6. The resonator element according to claim 1,
   wherein a second outer edge section that intersects with the vibration direction and the direction that is orthogonal to the vibration direction is provided in an end section of the second thick section on a side opposite to the third thick section, in the plan view.

7. The resonator element according to claim 6,
   wherein the second outer edge section is a second inclined outer edge section that is inclined with respect to the vibration direction and the direction that is orthogonal to the vibration direction, in the plan view, and
   wherein an inclination angle of the second inclined outer edge section with respect to the vibration direction is 30° or greater and 60° or less.

8. The resonator element according to claim 6,
   wherein the second outer edge section is a second inclined outer edge section that is provided over the first region.

9. A resonator comprising:
   the resonator element according to claim 1; and
   a package in which the resonator element is accommodated.

10. An oscillator comprising:
the resonator element according to claim 1; and
an oscillation circuit that drives the resonator element.

11. An electronic apparatus comprising the resonator element according to claim 1.

12. A moving object comprising the resonator element according to claim 1.

13. A resonator comprising:
the resonator element according to claim 2; and
a package in which the resonator element is accommodated.

14. An oscillator comprising:
the resonator element according to claim 2; and
an oscillation circuit that drives the resonator element.

15. An electronic apparatus comprising the resonator element according to claim 2.

16. A moving object comprising the resonator element according to claim 2.

* * * * *